United States Patent
Kohiki

(10) Patent No.: US 10,257,938 B2
(45) Date of Patent: Apr. 9, 2019

(54) SURFACE-TREATED COPPER FOIL, COPPER FOIL WITH CARRIER, SUBSTRATE, RESIN SUBSTRATE, PRINTED WIRING BOARD, COPPER CLAD LAMINATE AND METHOD FOR PRODUCING PRINTED WIRING BOARD

(71) Applicant: JX NIPPON MINING & METALS CORPORATION, Tokyo (JP)

(72) Inventor: Michiya Kohiki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 237 days.

(21) Appl. No.: 14/907,486

(22) PCT Filed: Jul. 24, 2014

(86) PCT No.: PCT/JP2014/069624
§ 371 (c)(1),
(2) Date: Jan. 25, 2016

(87) PCT Pub. No.: WO2015/012376
PCT Pub. Date: Jan. 29, 2015

(65) Prior Publication Data
US 2016/0157356 A1    Jun. 2, 2016

(30) Foreign Application Priority Data

Jul. 24, 2013  (JP) ................................. 2013-153732
Jul. 24, 2013  (JP) ................................. 2013-153765

(51) Int. Cl.
*H05K 3/02*    (2006.01)
*H05K 3/38*    (2006.01)
(Continued)

(52) U.S. Cl.
CPC ............. *H05K 3/025* (2013.01); *B32B 15/08* (2013.01); *B32B 15/20* (2013.01); *B32B 27/20* (2013.01);
(Continued)

(58) Field of Classification Search
CPC ........ H05K 3/025; H05K 3/205; H05K 3/389; H05K 3/384; H05K 3/388;
(Continued)

(56) References Cited

U.S. PATENT DOCUMENTS 6,777,108 B1 * 8/2004 Obata ...................... C25D 1/04
                                                           428/336
9,028,972 B2 * 5/2015 Kohiki ..................... H05K 3/38
                                                           205/111
(Continued)

FOREIGN PATENT DOCUMENTS

CN    102884228 A    1/2013
JP      07226575 A    8/1995
(Continued)

OTHER PUBLICATIONS

Atsushi (WO 2013/108415 A1)—Jan. 2013 (Google Patents machine translation to English) (Year: 2013).*
(Continued)

*Primary Examiner* — David Sample
*Assistant Examiner* — Donald M Flores, Jr.
(74) *Attorney, Agent, or Firm* — Drinker Biddle & Reath LLP

(57) ABSTRACT

The present invention provides a surface-treated copper foil capable of imparting the profile shape of the substrate surface after removal of the copper foil, the profile shape maintaining fine wiring formability and achieving satisfactory adhesion of electroless copper plating coating. The present invention also provides a resin substrate provided
(Continued)

with a profile shape of the surface maintaining fine wiring formability and achieving satisfactory adhesion of electroless copper plating coating. The surface-treated copper foil of the present invention is a surface-treated copper foil, wherein a surface-treated layer is formed on a copper foil, and the proportion of the area corresponding to the particles of the surface of the surface-treated layer is 0.1 to 0.85.

13 Claims, 8 Drawing Sheets

(51) Int. Cl.
    *H05K 3/20*      (2006.01)
    *B32B 15/08*      (2006.01)
    *C25D 7/06*      (2006.01)
    *C23C 18/16*      (2006.01)
    *B32B 15/20*      (2006.01)
    *B32B 27/20*      (2006.01)
    *C25D 5/10*      (2006.01)
    *H05K 1/09*      (2006.01)
    *C25D 1/04*      (2006.01)
    *C25D 3/38*      (2006.01)
    *C25D 3/58*      (2006.01)

(52) U.S. Cl.
CPC ............ *C23C 18/1653* (2013.01); *C25D 5/10* (2013.01); *C25D 7/0614* (2013.01); *H05K 3/205* (2013.01); *H05K 3/384* (2013.01); *H05K 3/389* (2013.01); *B32B 2457/08* (2013.01); *C25D 1/04* (2013.01); *C25D 3/38* (2013.01); *C25D 3/58* (2013.01); *C25D 7/0671* (2013.01); *H05K 1/09* (2013.01); *H05K 3/388* (2013.01); *H05K 2201/0355* (2013.01); *H05K 2203/0307* (2013.01); *H05K 2203/072* (2013.01); *H05K 2203/0726* (2013.01)

(58) Field of Classification Search
CPC ..... H05K 2203/0307; H05K 2203/072; H05K 1/09; H05K 2203/0726; H05K 2201/0355; C25D 5/10; C25D 7/0614; C25D 3/58; C25D 3/38; C25D 1/04; C25D 7/0671; B32B 27/20; B32B 15/20; B32B 15/08; B32B 2457/08; C23C 18/1653

See application file for complete search history.

(56) References Cited

U.S. PATENT DOCUMENTS

| | | |
|---|---|---|
| 2004/0038049 A1 | 2/2004 | Suzuki et al. |
| 2004/0067377 A1 | 4/2004 | Sugimoto et al. |
| 2005/0175826 A1* | 8/2005 | Suzuki ............... C25D 1/04 |
| | | 428/209 |
| 2008/0128288 A1 | 6/2008 | Hashimoto |
| 2009/0183901 A1 | 7/2009 | Kataoka et al. |
| 2012/0189859 A1* | 7/2012 | Nozaki ............... B32B 15/08 |
| | | 428/458 |
| 2013/0011690 A1* | 1/2013 | Arai .................. C25D 5/12 |
| | | 428/548 |
| 2013/0220685 A1 | 8/2013 | Kohiki et al. |
| 2015/0047884 A1 | 2/2015 | Nagaura et al. |

FOREIGN PATENT DOCUMENTS

| | | | |
|---|---|---|---|
| JP | 08197577 A | 8/1996 | |
| JP | 2005217052 A | 8/2005 | |
| JP | 2006196863 A | 7/2006 | |
| JP | 2006212659 A | 8/2006 | |
| JP | 2006229115 A | 8/2006 | |
| JP | 2008047655 A | 2/2008 | |
| JP | 5204908 B1 | 6/2013 | |
| TW | 200302036 A | 7/2003 | |
| TW | 200603705 A | 1/2006 | |
| WO | 2012043182 A1 | 4/2012 | |
| WO | WO-2012043182 A1 * | 4/2012 | ............ H05K 3/38 |
| WO | WO-2013/108415 A1 | 7/2013 | |
| WO | WO-2013108415 A1 * | 7/2013 | ............ C25D 1/04 |

OTHER PUBLICATIONS

Moriyama, et al. (WO 2012/043182 A1). (Apr. 5, 2012) (EPO—Machine translation to English). (Year: 2012).*
Extended EP Search Report in EP Application No. 14829332.7 dated Mar. 10, 2017.
PCT/JP2014/069624, English translation of the Written Opinion of the International Searching Authority (dated Oct. 28, 2014).

\* cited by examiner (a)

(b)

(e)

(f)

(g)

(h)

(1)

(2)

(3)

(4)

SURFACE-TREATED COPPER FOIL, COPPER FOIL WITH CARRIER, SUBSTRATE, RESIN SUBSTRATE, PRINTED WIRING BOARD, COPPER CLAD LAMINATE AND METHOD FOR PRODUCING PRINTED WIRING BOARD

TECHNICAL FIELD

The present invention relates to a surface-treated copper foil, a copper foil with carrier, a substrate, a resin substrate, a printed wiring board, a copper clad laminate and a method for producing a printed wiring board.

As the method for forming circuits of a semiconductor package substrate and a printed wiring board, a subtractive method is predominantly used. However, recently, due to high integration of semiconductors, miniaturization has been advanced in the circuits of semiconductor package substrates and printed wiring boards used for highly integrated semiconductors, and accordingly it has been becoming difficult to form fine circuits on the basis of subtractive methods.

As measures for forming further finer wirings, the following methods have been attracting attention: a circuit forming method (1) in which pattern copper plating is performed by using an ultra-thin copper foil as a power feeding layer, and finally the ultra-thin copper layer is removed by flash etching to form wirings; a circuit forming method (2) in which a prepreg or a build-up film is cured by vacuum pressing or the like, the surface of the cured material is roughened to form appropriate asperities on the surface of a substrate, and thus reliable fine wirings are formed on the substrate surface; and a circuit forming method (3) in which a surface profile of a copper foil is transferred to the surface of a substrate to form appropriate asperities on the substrate surface, and thus reliable fine airings are formed on the substrate surface. These methods are each generally referred to as a SAP (semi-additive process).

A SAP using the surface profile of a copper foil is described in, for example, Patent Literature 1. Examples of a typical SAP using such a surface profile of a copper foil includes the following. Specifically, here is quoted a method in which a copper foil laminated on a resin is subjected to an entire-surface etching, the etched surface of a substrate is subjected to hole opening, the hole-opening portions and the entire surface or part of the surface of the substrate are subjected to desmear treatment, a dry film is bonded to the etched surface of the hole opening portions, the dry film on the portions in which no circuit is formed is exposed and developed, the unnecessary portion of the dry film is removed with a chemical solution, electroless copper plating and electric copper plating are applied to the etched substrate surface having no coating dry film and having the copper foil surface profile transferred thereto, and finally the electroless copper plating layer is removed by flash etching to form fine wirings.

CITATION LIST

Patent Literature

Japanese Patent Laid-Open No. 2006-196863

SUMMARY OF INVENTION

Technical Problem

For forming fine wirings, it is preferable that the profile of the substrate surface be small and smooth; however, in such a case, the adhesion of the electroless copper plating coating is weak, and the reliability demanded for semiconductor package substrates or printed wiring boards is liable to be impaired. On the other hand, in order to ensure the adhesion of the electroless copper plating coating, it is preferable that the profile of the substrate surface be large; however, in such a case, fine wiring formability is liable to be impaired.

With these respects, the conventional technology has not yet performed sufficient investigation, to leave room for improvement. Accordingly, the present invention takes it as its object to provide a surface-treated copper foil capable of imparting the profile shape of the substrate surface after removal of the copper foil, the profile shape maintaining fine wiring formability and achieving satisfactory adhesion of electroless copper plating coating, and/or a resin substrate provided with such a profile shape of the surface thereof.

Solution to Problem

In order to achieve the above-described object, the present inventors continuously made a diligent study, and have consequently discovered that a surface-treated copper foil in which the area ratio of the area occupied by particles on the surface of a surface-treated layer is controlled so as to fall within a predetermined range is used, the surface-treated copper foil concerned is bonded to a substrate on which circuits are to be formed, then the surface-treated copper foil is removed, and thus, it is possible to provide a profile shape of the substrate surface after removal of the copper foil, the profile shape maintaining the fine wiring formability and achieving satisfactory adhesion of electroless copper plating coating In addition, the present inventors have discovered that by using a resin substrate in which the asperity form of the surface of the resin substrate is quantified and controlled so as for the numerical value range to be controlled, the fine wiring formability can be maintained and the satisfactory adhesion of the electroless copper plating coating can be achieved, during forming circuits on the surface of the resin substrate.

The present invention has been perfected on the basis of the above-described discovery, and an aspect of the present invention is a surface-treated copper foil, wherein a surface-treated layer is formed on a copper foil, and the proportion of the area corresponding to the particles of the surface of the surface-treated layer is 0.1 to 0.85.

In another aspect, the present invention is a surface-treated copper foil, wherein a surface-treated layer is formed on a copper foil, and the proportion of the area corresponding to the particles of the surface of the surface-treated layer is 0.1 to 0.7.

In yet another aspect, the present invention is a surface-treated copper foil, wherein a surface-treated layer is formed on a copper foil, and the average diameter of the particles on the surface of the surface-treated layer is 0.03 to 0.28 µm.

In yet another aspect, the present invention is a surface-treated copper foil, wherein a surface-treated layer is formed on a copper foil, and the average diameter of the particles on the surface of the surface-treated layer is 0.05 to 0.28 µm.

In yet another aspect, the present invention is a surface-treated copper foil, wherein a surface-treated layer is formed on a copper foil, and the number density of the particles on the surface of the surface-treated layer is 3.8 to 430 particles/µm$^2$.

In yet another aspect, the present invention is a surface-treated copper foil, wherein a surface-treated layer is formed on a copper foil, and the number density of the particles on the surface of the surface-treated layer is 3.8 to 16.0 particles/$\mu m^2$.

In yet another aspect, the present invention is a surface-treated copper foil, wherein when a surface-treated copper foil is bonded, via the surface-treated layer side thereof, to a resin substrate and the surface-treated copper foil is removed, the average length of the white portions on the surface, on the copper foil removal side, of the resin substrate is 0.07 to 0.23 $\mu m$.

In yet another aspect, the present invention is a surface-treated copper foil, wherein when a surface-treated copper foil is bonded, via the surface-treated layer side thereof, to a resin substrate and the surface-treated copper foil is removed, the average length of the white portions on the surface, on the copper foil removal side, of the resin substrate is 0.14 to 0.23 $\mu m$.

In yet another aspect, the present invention is a surface-treated copper foil, wherein when a surface-treated copper foil is bonded, via the surface-treated layer side thereof, to a resin substrate and the surface-treated copper foil is removed, the maximum length of the white portions on the surface, on the copper foil removal side, of the resin substrate is 0.704 to 0.88 $\mu m$.

In yet another aspect, the present invention is a surface-treated copper foil, wherein when a surface-treated copper foil is bonded, via the surface-treated layer side thereof, to a resin substrate and the surface-treated copper foil is removed, the average length of the largest 10 white portions on the surface, on the copper foil removal side, of the resin substrate is 0.15 to 0.457 $\mu m$.

In yet another aspect, the present invention is a surface-treated copper foil, wherein when a surface-treated copper foil is bonded, via the surface-treated layer side thereof, to a resin substrate and the surface-treated copper foil is removed, the average length of the largest 10 white portions on the surface, on the copper foil removal side, of the resin substrate is 0.20 to 0.457 $\mu m$.

In yet another aspect, the present invention is a surface-treated copper foil, wherein when a surface-treated copper foil is bonded, via the surface-treated layer side thereof, to a resin substrate and the surface-treated copper foil is removed, the average length of the black portions on the surface, on the copper foil removal side, of the resin substrate is 0.035 to 0.20 $\mu m$.

In yet another aspect, the present invention is a surface-treated copper foil, wherein when a surface-treated copper foil is bonded, via the surface-treated layer side thereof, to a resin substrate and the surface-treated copper foil is removed, the average length of the black portions on the surface, on the copper foil removal side, of the resin substrate is 0.05 to 0.20 $\mu m$.

In yet another aspect, the present invention is a surface-treated copper foil, wherein when a surface-treated copper foil is bonded, via the surface-treated layer side thereof, to a resin substrate and the surface-treated copper foil is removed, the average length of the black portions on the surface, on the copper foil removal side, of the resin substrate is 0.07 to 0.20 $\mu m$.

In yet another aspect, the present invention is a surface-treated copper foil, wherein when a surface-treated copper foil is bonded, via the surface-treated layer side thereof, to a resin substrate and the surface-treated copper foil is removed, the maximum length of the black portions on the surface, on the copper foil removal side, of the resin substrate is 0.180 to 0.605 $\mu m$.

In yet another aspect, the present invention is a surface-treated copper foil, wherein when a surface-treated copper foil is bonded, via the surface-treated layer side thereof, to a resin substrate and the surface-treated copper foil is removed, the maximum length of the black portions on the surface, on the copper foil removal side, of the resin substrate is 0.355 to 0.605 $\mu m$.

In yet another aspect, the present invention is a surface-treated copper foil, wherein when a surface-treated copper foil is bonded, via the surface-treated layer side thereof, to a resin substrate and the surface-treated copper foil is removed, the average length of the largest 10 black portions on the surface, on the copper foil removal side, of the resin substrate is 0.06 to 0.335 $\mu m$.

In yet another aspect, the present invention is a surface-treated copper foil, wherein when a surface-treated copper foil is bonded, via the surface-treated layer side thereof, to a resin substrate and the surface-treated copper foil is removed, the average length of the largest 10 black portions on the surface, on the copper foil removal side, of the resin substrate is 0.13 to 0.335 $\mu m$.

In an embodiment, in the surface-treated copper foil of the present invention, when a surface-treated copper foil is bonded, via the surface-treated layer side thereof, to a resin substrate and the surface-treated copper foil is removed, the proportion of the white portions on the surface, on the copper foil removal side, of the resin substrate is 55 to 68%.

In an embodiment, the surface-treated copper foil of the present invention satisfies at least one of the following (A) to (I):

(A) the proportion of the area corresponding to the particles of the surface of the surface-treated layer is 0.1 to 0.85, (B) the average diameter of the particles on the surface of the surface-treated layer is 0.03 to 0.28 $\mu m$, (C) the number density of the particles on the surface of the surface-treated layer is 3.8 to 430 particles/$\mu m^2$, (D) when a surface-treated copper foil is bonded, via the surface-treated layer side thereof, to a resin substrate and the surface-treated copper foil is removed, the average length of the white portions on the surface, on the copper foil removal side, of the resin substrate is 0.07 to 0.23 $\mu m$, (E) when a surface-treated copper foil is bonded, via the surface-treated layer side thereof, to a resin substrate and the surface-treated copper foil is removed, the maximum length of the white portions on the surface, on the copper foil removal side, of the resin substrate is 0.704 to 0.88 $\mu m$, (F) when a surface-treated copper foil is bonded, via the surface-treated layer side thereof, to a resin substrate and the surface-treated copper foil is removed, the average length of the largest 10 white portions on the surface, on the copper foil removal side, of the resin substrate is 0.15 to 0.457 $\mu m$, (G) when a surface-treated copper foil is bonded, via the surface-treated layer side thereof, to a resin substrate and the surface-treated copper foil is removed, the average length of the black portions on the surface, on the copper foil removal side, of the resin substrate is 0.035 to 0.20 $\mu m$, (H) when a surface-treated copper foil is bonded, via the surface-treated layer side thereof, to a resin substrate and the surface-treated copper foil is removed, the maximum length of the black portions on the surface, on the copper foil removal side, of the resin substrate is 0.180 to 0.605 $\mu m$, (I) when a surface-treated copper foil is bonded, via the surface-treated layer side thereof, to a resin substrate and the surface-treated copper foil is removed, the average length of the largest 10 black portions on the surface, on the copper foil removal side, of the resin substrate is 0.06 to 0.335 $\mu m$.

In another embodiment, in the surface-treated copper foil of the present invention, the surface-treated layer is a roughening-treated layer.

In yet another embodiment, in the surface-treated copper foil of the present invention, the roughening-treated layer is a layer composed of a single substance selected from or an alloy including one or more selected from the group consisting of copper, nickel, cobalt, phosphorus, tungsten, arsenic, molybdenum, chromium and zinc.

In yet another embodiment, the surface-treated copper foil of the present invention has, on the surface of the roughening-treated layer, one or more layers selected from the group consisting of a heat resistant layer, a rust-preventing layer, a chromate-treated layer and a silane coupling treated layer.

In a yet another embodiment, in the surface-treated copper foil of the present invention, the surface-treated layer is one or more layers selected from the group consisting of a roughening-treated layer, a heat resistant layer, a rust-preventing layer, a chromate-treated layer and a silane coupling treated layer.

In a yet another embodiment, the surface-treated copper foil of the present invention is provided with a resin layer on the surface-treated layer.

In yet another aspect, the present invention is a copper foil with carrier, including a carrier, an intermediate layer and an ultra-thin copper layer in this order, wherein the ultra-thin copper layer is the surface-treated copper foil of the present invention.

In an embodiment, the copper foil with carrier of the present invention includes the ultra-thin copper layer on each of both surfaces of the carrier.

In another embodiment, the copper foil with carrier of the present invention includes a roughening-treated layer on the side opposite to the ultra-thin copper layer of the carrier.

In yet another aspect, the present invention is a substrate prepared by bonding the surface-treated copper foil of the present invention, via the surface-treated layer side thereof, to a substrate, and by removing the surface-treated copper foil, or a substrate prepared by bonding the copper foil with carrier of the present invention, via the ultra-thin copper layer side thereof, to a substrate, and by removing the copper foil with carrier, and the average length of the white portions on the surface, on the copper foil removal side, of the substrate is 0.16 to 0.25 μm.

In yet another aspect, the present invention is a substrate prepared by bonding the surface-treated copper foil of the present invention, via the surface-treated layer side thereof, to a substrate, and by removing the surface-treated copper foil, or a substrate prepared by bonding the copper foil with carrier of the present invention, via the ultra-thin copper layer side thereof, to a substrate, and by removing the copper foil with carrier, and the maximum length of the white portions on the surface, on the copper foil removal side, of the substrate is 0.785 to 0.98 μm.

In yet another aspect, the present invention is a substrate prepared by bonding the surface-treated copper foil of the present invention, via the surface-treated layer side thereof, to a substrate, and by removing the surface-treated copper foil, or a substrate prepared by bonding the copper foil with carrier of the present invention, via the ultra-thin copper layer side thereof, to a substrate, and by removing the copper foil with carrier, and the average length of the largest 10 white portions on the surface, on the copper foil removal side, of the substrate is 0.32 to 0.505 μm.

In yet another aspect, the present invention is a substrate prepared by bonding the surface-treated copper foil of the present invention, via the surface-treated layer side thereof, to a substrate, and by removing the surface-treated copper foil, or a substrate prepared by bonding the copper foil with carrier of the present invention, via the ultra-thin copper layer side thereof, to a substrate, and by removing the copper foil with carrier, and the average length of the black portions on the surface, on the copper foil removal side, of the substrate is 0.08 to 0.22 μm.

In yet another aspect, the present invention is a substrate prepared by bonding the surface-treated copper foil of the present invention, via the surface-treated layer side thereof, to a substrate, and by removing the surface-treated copper foil, or a substrate prepared by bonding the copper foil with carrier of the present invention, via the ultra-thin copper layer side thereof, to a substrate, and by removing the copper foil with carrier, and the maximum length of the black portions on the surface, on the copper foil removal side, of the substrate is 0.4 to 0.675 μm.

In yet another aspect, the present invention is a substrate prepared by bonding the surface-treated copper foil of the present invention, via the surface-treated layer side thereof, to a substrate, and by removing the surface-treated copper foil, or a substrate prepared by bonding the copper foil with carrier of the present invention, via the ultra-thin copper layer side thereof, to a substrate, and by removing the copper foil with carrier, and the average length of the largest 10 black portions on the surface, on the copper foil removal side, of the substrate is 0.15 to 0.37 μm.

In yet another aspect, the present invention is a substrate prepared by bonding the surface-treated copper foil of the present invention, via the surface-treated layer side thereof, to a substrate, and by removing the surface-treated copper foil, or a substrate prepared by bonding the copper foil with carrier of the present invention, via the ultra-thin copper layer side thereof, to a substrate, and by removing the copper foil with carrier, and the proportion of the white portions on the surface, on the copper foil removal side, of the substrate is 55 to 68%.

In yet another aspect, the present invention is a copper clad laminate produced by using the surface-treated copper foil of the present invention, or the copper foil with carrier of the present invention.

In yet another aspect, the present invention is a printed wiring board produced by using the surface-treated copper foil of the present invention, or the copper foil with carrier of the present invention.

In yet another aspect, the present invention is an electronic device using the printed wiring board of the present invention.

In yet another aspect, the present invention is a method for producing a printed wiring board, including:
a step of preparing the surface-treated copper foil of the present invention and an insulating substrate;
a step of laminating the surface-treated copper foil, via the surface-treated layer side thereof, on the insulating substrate;
a step of removing the surface-treated copper foil on the insulating substrate; and
a step of forming a circuit on the surface of the insulating substrate with the surface-treated copper foil removed therefrom.

In yet another aspect, the present invention is a method for producing a printed wiring board, including:
a step of preparing the copper foil with carrier of the present invention and an insulating substrate;
a step of laminating the copper foil with carrier, via the ultra-thin copper layer side thereof, on the insulating substrate;

a step of peeling the carrier of the copper foil with carrier after laminating the copper foil with carrier and the insulating substrate on each other;

a step of removing the ultra-thin copper layer on the insulating substrate after peeling the carrier; and a step of forming a circuit on the surface of the insulating substrate with the ultra-thin copper layer removed therefrom.

In yet another aspect, the present invention is a method for producing a printed wiring board, including:

a step of preparing the surface-treated copper foil of the present invention and an insulating substrate;

a step of forming a copper clad laminate by laminating the surface-treated copper foil, via the surface-treated layer side thereof, on the insulating substrate; and a step of subsequently forming a circuit by a semi-additive method, a subtractive method, a partly additive method or a modified semi-additive method.

In yet another aspect, the present invention is a method for producing a printed wiring board, including:

a step of preparing the copper foil with carrier of the present invention and an insulating substrate;

a step of laminating the copper foil with carrier, via the ultra-thin copper layer side thereof, on the insulating substrate;

a step of forming a copper clad laminate by passing through a step of peeling the carrier of the copper foil with carrier after laminating the copper foil with carrier and the insulating substrate on each other; and a step of subsequently forming a circuit by a semi-additive method, a subtractive method, a partly additive method or a modified semi-additive method.

In yet another aspect, the present invention is a method for producing a printed wiring board, including:

a step of preparing the surface-treated copper foil of the present invention, with a circuit formed on the surface thereof on the surface-treated layer formed side, or the copper foil with carrier of the present invention, with a circuit formed on the surface thereof on the ultra-thin copper layer side;

a step of forming a resin layer on the surface of the surface-treated copper foil or the surface of the copper foil with carrier so as for the circuit to be embedded;

a step of forming a circuit on the surface of the resin layer; and a step of exposing the circuit embedded in the resin layer by removing the surface-treated copper foil or the copper foil with carrier.

In yet another aspect, the present invention is a method for producing a printed wiring board, including:

a step of preparing a metal foil with a circuit formed on the surface thereof, or a first surface-treated copper foil being the surface-treated copper foil of the present invention with a circuit formed on the surface thereof on the surface-treated layer formed side, or a metal foil with carrier with a circuit formed on the surface thereof on the ultra-thin metal layer side, or a first copper foil with carrier being the copper foil with carrier of the present invention with a circuit formed on the surface thereof on the ultra-thin copper layer side;

a step of forming a resin layer on the surface of the metal foil, the surface of the surface-treated copper foil, the surface of the metal foil with carrier, or the surface of the copper foil with carrier so as for the circuit to be embedded;

a step of laminating a second surface-treated copper foil being the surface-treated copper foil of the present invention, via the surface-treated layer side thereof, on the resin layer, or a step of laminating a second copper foil with carrier being the copper foil with carrier of the present invention, via the ultra-thin copper layer side thereof, on the resin layer;

a step of peeling the carrier of the second copper foil with carrier, in the case where the foil laminated on the resin layer is the second copper foil with carrier;

a step of removing the surface-treated copper foil on the resin layer, or the ultra-thin copper layer remaining after peeling the carrier of the second copper foil with carrier;

a step of forming a circuit on the surface of the resin layer with the surface-treated copper foil removed therefrom, or on the surface of the resin layer with the ultra-thin copper layer removed therefrom; and a step of exposing the circuit embedded in the resin layer after forming the circuit on the resin layer, by removing the metal foil or the first surface-treated copper foil, or by removing the ultra-thin metal layer after peeling the carrier of the metal foil with carrier, or by removing the ultra-thin copper layer after peeling the carrier of the first copper foil with carrier.

In yet another aspect, the present invention is a method for producing a printed wiring board, including:

a step of preparing the surface-treated copper foil of the present invention with a circuit formed on the surface thereof on the surface-treated layer formed side, or the copper foil with carrier of the present invention with a circuit formed on the surface thereof on the ultra-thin copper layer side;

a step of forming a resin layer on the surface of the surface-treated copper foil or the surface of the copper foil with carrier so as for the circuit to be embedded;

a step of laminating a metal foil on the resin layer, or a step of laminating a metal foil with carrier, via the ultra-thin metal layer side thereof, on the resin layer;

a step of peeling the carrier of the metal foil with carrier, in the case where the foil laminated on the resin layer is the metal foil with carrier;

a step of removing the metal foil on the resin layer, or the ultra-thin metal layer remaining after peeling the carrier of the metal foil with carrier;

a step of forming a circuit on the surface of the resin layer with the metal foil removed therefrom, or the surface of the resin layer with the ultra-thin copper layer removed therefrom; and a step of exposing the circuit embedded in the resin layer circuit after forming the circuit on the resin layer, by removing the surface-treated copper foil, or by removing the ultra-thin copper layer after peeling the carrier of the copper foil with carrier.

In yet another aspect, the present invention is a method for producing a printed wiring board, including:

a step of preparing a metal foil with a circuit formed on the surface thereof, or a first surface-treated copper foil being the surface-treated copper foil of the present invention with a circuit formed on the surface thereof on the surface-treated layer formed side, or a metal foil with carrier with a circuit formed on the surface thereof on the ultra-thin metal layer side, or a first copper foil with carrier being the copper foil with carrier of the present invention with a circuit formed on the surface thereof on the ultra-thin copper layer side;

a step of forming a resin layer on the surface of the metal foil, or the surface of the surface-treated copper foil, or the surface of the metal foil with carrier, or the surface of the copper foil with carrier so as for the circuit to be embedded;

a step of laminating a second surface-treated copper foil being the surface-treated copper foil of the present invention, via the surface-treated layer side thereof, on the resin layer, or a step of laminating a second copper foil with carrier being the copper foil with carrier of the present invention, via the ultra-thin copper layer side thereof, on the resin layer;

a step of peeling the carrier of the second copper foil with carrier, in the case where the foil laminated on the resin layer is the second copper foil with carrier;

a step of forming a circuit on the resin layer, by using the surface-treated copper foil on the resin layer, or the ultra-thin copper layer remaining after peeling the carrier of the second copper foil with carrier, by a semi-additive method, a subtractive method, a partly additive method or a modified semi-additive method; and a step of exposing the circuit embedded in the resin layer after forming the circuit on the resin layer, by removing the metal foil or by removing the first surface-treated copper foil, or by removing the ultra-thin metal layer after peeling the carrier of the metal foil with carrier, or by removing the ultra-thin copper layer after peeling the carrier of the first copper foil with carrier.

In yet another aspect, the present invention is a method for producing a printed wiring board, including:

a step of preparing the surface-treated copper foil of the present invention with a circuit formed on the surface thereof on the surface-treated layer formed side, or the copper foil with carrier of the present invention with a circuit formed on the surface thereof on the ultra-thin copper layer side;

a step of forming a resin layer on the surface of the surface-treated copper foil or the surface of the copper foil with carrier so as for the circuit to be embedded;

a step of laminating a metal foil on the resin layer, or a step of laminating a metal foil with carrier, via the ultra-thin metal layer side thereof, on the resin layer;

a step of peeling the carrier of the metal foil with carrier, in the case where the foil laminated on the resin layer is the metal foil with carrier;

a step of forming a circuit on the resin layer by using the metal foil on the resin layer, or the ultra-thin metal layer remaining after peeling the carrier of the metal foil with carrier, by a semi-additive method, a subtractive method, a partly additive method or a modified semi-additive method; and a step of exposing the circuit embedded in the resin layer after forming the circuit on the resin layer, by removing the surface-treated copper foil, or by removing the ultra-thin copper layer after peeling the carrier of the copper foil with carrier.

In yet another aspect, the present invention is a resin substrate, wherein the average length of the white portions on the surface thereof is 0.07 to 0.23 μm.

In an embodiment, in the resin substrate of the present invention, the maximum length of the white portions on the surface thereof is 0.704 to 0.88 μm.

In another embodiment, in the resin substrate of the present invention, the average length of the largest 10 white portions on the surface thereof is 0.15 to 0.457 μm.

In yet another embodiment, in the resin substrate of the present invention, the average length of the black portions on the surface thereof is 0.035 to 0.20 μm.

In yet another embodiment, in the resin substrate of the present invention, the maximum length of the black portions on the surface thereof is 0.180 to 0.605 μm.

In yet another embodiment, in the resin substrate of the present invention, the average length of the largest 10 black portions on the surface thereof is 0.06 to 0.335 μm.

In yet another embodiment, in the resin substrate of the present invention, the proportion of the white portions on the surface thereof is 55 to 68%.

In yet another aspect, the present invention is a resin substrate, wherein the maximum length of the white portions on the surface thereof is 0.704 to 0.88 μm.

In yet another embodiment, in the resin substrate of the present invention, the average length of the largest 10 white portions on the surface thereof is 0.15 to 0.457 μm.

In yet another embodiment, in the resin substrate of the present invention, the average length of the black portions on the surface thereof is 0.035 to 0.20 μm.

In yet another embodiment, in the resin substrate of the present invention, the maximum length of the black portions on the surface thereof is 0.180 to 0.605 μm.

In yet another embodiment, in the resin substrate of the present invention, the average length of the largest 10 black portions on the surface thereof is 0.06 to 0.335 μm.

In yet another embodiment, in the resin substrate of the present invention, the proportion of the white portions on the surface thereof is 55 to 68%.

In yet another aspect, the present invention is a resin substrate, wherein the average length of the largest 10 white portions on the surface thereof is 0.15 to 0.457 μm.

In yet another embodiment, in the resin substrate of the present invention, the average length of the black portions on the surface thereof is 0.035 to 0.20 μm.

In yet another embodiment, in the resin substrate of the present invention, the maximum length of the black portions on the surface thereof is 0.180 to 0.605 μm.

In yet another embodiment, in the resin substrate of the present invention, the average length of the largest 10 black portions on the surface thereof is 0.06 to 0.335 μm.

In yet another embodiment, in the resin substrate of the present invention, the proportion of the white portions on the surface thereof is 55 to 68%.

In yet another aspect, the present invention is a resin substrate, wherein the average length of the black portions on the surface thereof is 0.035 to 0.20 μm.

In yet another embodiment, in the resin substrate of the present invention, the maximum length of the black portions on the surface thereof is 0.180 to 0.605 μm.

In yet another embodiment, in the resin substrate of the present invention, the average length of the largest 10 black portions on the surface thereof is 0.06 to 0.335 μm.

In yet another embodiment, in the resin substrate of the present invention, the proportion of the white portions on the surface thereof is 55 to 68%.

In yet another aspect, the present invention is a resin substrate, wherein the maximum length of the black portions on the surface thereof is 0.180 to 0.605 μm.

In yet another embodiment, in the resin substrate of the present invention, the average length of the largest 10 black portions on the surface thereof is 0.06 to 0.335 μm.

In yet another embodiment, in the resin substrate of the present invention, the proportion of the white portions on the surface thereof is 55 to 68%.

In yet another aspect, the present invention is a resin substrate, wherein the average length of the largest 10 black portions on the surface thereof is 0.06 to 0.335 μm.

In yet another embodiment, in the resin substrate of the present invention, the proportion of the white portions on the surface thereof is 55 to 68%.

In yet another aspect, the present invention is a resin substrate, wherein the proportion of the white portions on the surface thereof is 55 to 68%.

In yet another embodiment, the resin substrate of the present invention satisfies at least one of the following (A) to (G)

(A) the average length of the white portions on the surface thereof is 0.07 to 0.23 µm, (B) the maximum length of the white portions on the surface thereof is 0.704 to 0.88 µm, (C) the average length of the largest 10 white portions on the surface thereof is 0.15 to 0.457 µm, (D) the average length of the black portions on the surface thereof is 0.035 to 0.20 µm, (E) the maximum length of the black portions on the surface thereof is 0.180 to 0.605 µm, (F) the average length of the largest 10 black portions on the surface thereof is 0.06 to 0.335 µm, (G) the proportion of the white portions on the surface thereof is 55 to 68%.

In yet another embodiment, the resin substrate of present invention is for use in the semi-additive method.

In yet another aspect, the present invention is a copper clad laminate produced by using the resin substrate of the present invention.

In yet another aspect, the present invention is a printed wiring board produced by using the resin substrate of the present invention.

In yet another aspect, the present invention is an electronic device using the printed wiring board of the present invention.

In yet another aspect, the present invention is a method for producing a printed wiring board, including:

a step of preparing a surface-treated copper foil and a resin substrate;

a step of laminating the surface-treated copper foil, via the surface-treated layer side thereof, on the resin substrate;

a step of obtaining the resin substrate of the present invention by removing the surface-treated copper foil on the resin substrate; and a step of forming a circuit on the surface of the resin substrate with the surface-treated copper foil removed therefrom.

In yet another aspect, the present invention is a method for producing a printed wiring board, including:

a step of preparing a copper foil with carrier constituted by laminating a carrier, an intermediate layer and an ultra-thin copper layer in this order, and a resin substrate;

a step of laminating the copper foil with carrier, via the ultra-thin copper layer side thereof, on the resin substrate;

a step of peeling the carrier of the copper foil with carrier after laminating the copper foil with carrier and the resin substrate on each other;

a step of obtaining the resin substrate of the present invention by removing the ultra-thin copper layer on the resin substrate after peeling the carrier; and a step of forming a circuit on the surface of the resin substrate with the ultra-thin copper layer removed therefrom.

In yet another aspect, the present invention is a method for producing a printed wiring board, including: a step of forming a circuit, after forming a copper clad laminate by laminating a surface-treated copper foil via the surface-treated layer side thereof, on the resin substrate of the present invention, by a semi-additive method, a subtractive method, a partly additive method or a modified semi-additive method.

In yet another aspect, the present invention is a method for producing a printed wiring board, including:

a step of laminating a copper foil with carrier constituted by laminating a carrier, an intermediate layer and an ultra-thin copper layer in this order, via the ultra-thin copper layer side thereof, on the resin substrate of the present invention;

a step of forming a copper clad laminate by passing through a step of peeling the carrier of the copper foil with carrier after laminating the copper foil with carrier and the resin substrate on each other; and a step of subsequently forming a circuit by a semi-additive method, a subtractive method, a partly additive method or a modified semi-additive method.

In yet another aspect, the present invention is a method for producing a printed wiring board, including:

a step of preparing a metal foil with a circuit formed on the surface thereof;

a step of forming a resin substrate on the surface of the metal foil so as for the circuit to be embedded;

a step of laminating a surface-treated copper foil, via the surface-treated layer side thereof, on the resin substrate;

a step of obtaining the resin substrate of the present invention by removing the surface-treated copper foil on the resin substrate;

a step of forming a circuit on the surface of the resin substrate with the surface-treated copper foil removed therefrom; and a step of exposing the circuit formed on the surface of the metal foil and embedded in the resin substrate by removing the metal foil.

In yet another aspect, the present invention is a method for producing a printed wiring board, including:

a step of preparing a metal foil with a circuit formed on the surface thereof;

a step of forming a resin substrate on the surface of the metal foil so as for the circuit to be embedded;

a step of laminating a copper foil with carrier including a carrier, an intermediate layer and an ultra-thin copper layer in this order, via the surface thereof on the ultra-thin copper layer side, on the resin substrate;

a step of obtaining the resin substrate of the present invention by removing the ultra-thin copper layer on the resin substrate after peeling the carrier of the copper foil with carrier;

a step of forming a circuit on the surface of the resin substrate with the ultra-thin copper layer removed therefrom; and a step of exposing the circuit formed on the surface of the metal foil and embedded in the resin substrate by removing the metal foil.

In yet another aspect, the present invention is a method for producing a printed wiring board, including:

a step of forming a circuit on the surface on the ultra-thin copper layer side of a first copper foil with carrier constituted by laminating a carrier, an intermediate layer and an ultra-thin copper layer in this order;

a step of forming a resin substrate on the surface on the ultra-thin copper layer side of the first copper foil with carrier so as for the circuit to be embedded;

a step of preparing a second copper foil with carrier constituted by laminating a carrier, an intermediate layer and an ultra-thin copper layer in this order, and laminating the second copper foil with carrier, via the ultra-thin copper layer side thereof, on the resin substrate;

a step of peeling the carrier of the second copper foil with carrier after laminating the second copper foil with carrier on the resin substrate;

a step of obtaining the resin substrate of the present invention by removing the ultra-thin copper layer on the resin substrate after peeling the carrier of the second copper foil with carrier;

a step of forming a circuit on the surface of the resin substrate with the ultra-thin copper layer removed therefrom;

a step of peeling the carrier of the first copper foil with carrier after forming the circuit on the resin substrate; and a step of exposing the circuit formed on the surface on the ultra-thin copper layer side of the first copper foil with carrier and embedded in the resin substrate, by removing the ultra-thin copper layer of the first copper foil with carrier after peeling the carrier of the first copper foil with carrier.

In yet another aspect, the present invention is a method for producing a printed wiring board, including:

a step of forming a circuit on the surface on the ultra-thin copper layer side of a copper foil with carrier including a carrier, an intermediate layer and an ultra-thin copper layer in this order;

a step of forming a resin substrate on the surface on the ultra-thin copper layer side of the copper foil with carrier so as for the circuit to be embedded;

a step of laminating a surface-treated copper foil, via the surface-treated layer side thereof, on the resin substrate;

a step of obtaining the resin substrate of the present invention by removing the surface-treated copper foil on the resin substrate;

a step of forming a circuit on the surface of the resin substrate with the surface-treated copper foil having been removed therefrom;

a step of peeling the carrier of the copper foil with carrier after forming a circuit on the resin substrate; and a step of exposing the circuit formed on the surface on the ultra-thin copper layer side of the copper foil with carrier by removing the ultra-thin copper layer of the copper foil with carrier after peeling the carrier of the copper foil with carrier.

In yet another aspect, the present invention is a method for producing a printed wiring board, including:

a step of preparing a metal foil with a circuit formed on the surface thereof;

a step of forming the resin substrate of the present invention so as for the circuit to be embedded;

a step of forming a circuit on the resin substrate; and a step of exposing the circuit formed on the surface of the metal foil and embedded in the resin substrate by removing the metal foil.

In yet another aspect, the present invention is a method for producing a printed wiring board, including:

a step of forming a circuit on the surface on the ultra-thin copper layer side of a copper foil with carrier constituted by laminating a carrier, an intermediate layer and an ultra-thin copper layer in this order;

a step of forming the resin substrate of the present invention on the surface on the ultra-thin copper layer side of the copper foil with carrier so as for the circuit to be embedded;

a step of forming a circuit on the resin substrate;

a step of peeling the carrier of the copper foil with carrier after forming the circuit on the resin substrate; and a step of exposing the circuit formed on the surface on the ultra-thin copper layer side of the copper foil with carrier and embedded in the resin substrate by removing the ultra-thin copper layer of the copper foil with carrier after peeling the carrier of the copper foil with carrier.

Advantageous Effects of Invention

According to the present invention, it is possible to provide a surface-treated copper foil capable of imparting a profile shape on the substrate surface after removal of the copper foil, capable of maintaining fine wiring formability and implementing satisfactory adhesion of electroless copper plating coating, and/or a resin substrate provided with the profile shape of the surface.

DESCRIPTION OF EMBODIMENTS

[Resin Substrate]

The resin substrate according to the present invention is not particularly limited as long as the resin substrate allows the below-described surface shape to be formed; the resin substrate concerned can be formed with, for example, a prepreg (GHPL-830MBT or the like) manufactured by Mitsubishi Gas Chemical Company, Inc., a prepreg (679-FG or the like) manufactured by Hitachi Chemical Co., Ltd., and a prepreg (EI-6785TS-F or the like) manufactured by Sumitomo Bakelite Co., Ltd. In the present invention, the prepreg GHPL-830MBT manufactured by Mitsubishi Gas Chemical Company, Inc. was prepared. As the temperature, pressure and time of a laminating press, the conditions recommended by the substrate maker were used.

The thickness of the resin substrate according to the present invention is not particularly limited; however, the thickness of the resin substrate can be, for example, 750 to 850 μm, 100 to 200 μm, or 30 to 100 μm, and is typically 30 to 200 μm (in the case of a double-sided plate).

[Average Size of White Portions and Average Size of Black Portions on Surface of Resin Substrate]

In the resin substrate of the present invention, the average length of the white portions on the surface thereof is 0.07 to 0.23 μm. In addition, in the resin substrate of the present invention, the average length of the black portions on the surface thereof is preferably 0.035 to 0.20 μm.

Figure 1:
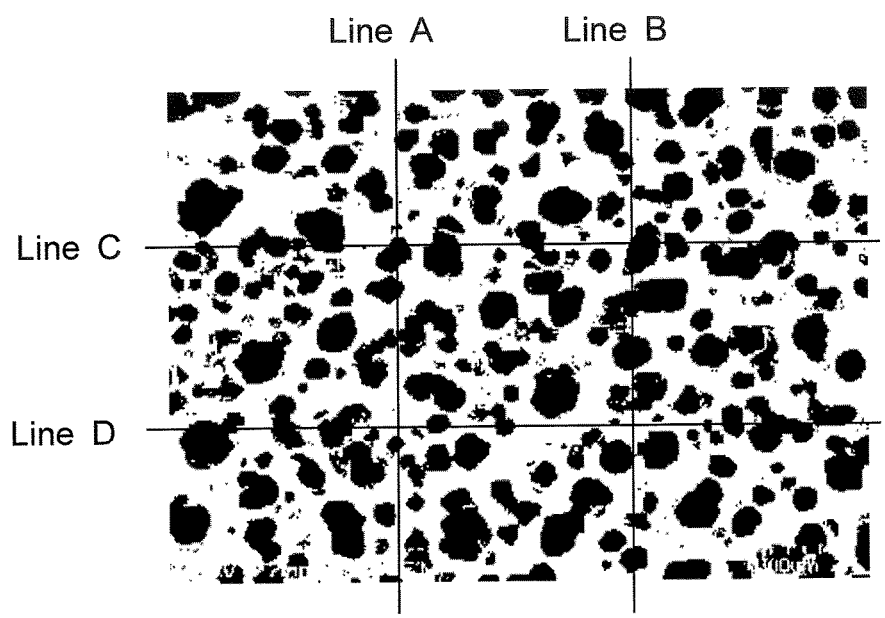
FIG. 1 is a schematic diagram illustrating the white portions and the black portions on the surface of a resin substrate.

Here, FIG. 1 shows a schematic diagram illustrating the white portions concerned and the black portions described below, on the surface of a resin substrate. FIG. 1 is an image obtained by obtaining the SEM image (magnification: 30 k) of the surface of the resin substrate and by applying a black-white image processing to the SEM image by using Photo Shop 7.0 software. It is to be noted that the black portions (the black region) indicate that the measurement surface is concave, and the white portions (the white region) indicate that the measurement surface is convex. Next, as shown in FIG. 1, four lines (the lines A to D) are drawn to divide the obtained image into nine equal areas; the sum of the lengths of the line segments passing through the above-described white portions (the white region) is measured for each of the lines A to D, and the total of the sums for the lines A to D is calculated to determine the length of the white portions. This measurement is performed for three fields of view of the surface of the resin substrate as the measurement object, and the average value of the values of the three fields of view is taken as the average length (μm) of the white portions. Additionally, four lines (the lines A to D) are drawn, the sum of the lengths of the line segments passing through the above-described black portions (the black region) is measured for each of the lines A to D, and the total of the sums for the lines A to D is calculated to determine the length of the black portions. This measurement is performed for three fields of view of the surface of the resin substrate as the measurement object, and the average value of the values of the three fields of view is taken as the average length (pi) of the black portions.

When the average length of the white portions is less than 0.07 μm, the anchor effect is weakened to result in a poor adhesion to the coating. On the other hand, when the average length of the white portions exceeds 0.23 μm, the asperities of the surface of the substrate are too small, and a poor adhesion to the coating is caused. The average length of the white portions is preferably 0.09 to 0.23 μm, more preferably 0.12 to 0.23 μm, furthermore preferably 0.14 to 0.23 μm, furthermore preferably 0.15 to 0.225 μm, and furthermore preferably 0.16 to 0.220 μm.

When the average length of the black portions is less than 0.035 μm, the infiltration of a plating solution for forming the coating on the surface of the substrate is made difficult to result in a poor adhesion to the coating. On the other hand, when the average length of the black portions exceeds 0.20 μm, the anchor effect is weakened to result in a poor adhesion to the coating. The average length of the black portions is preferably 0.05 to 0.20 μm and more preferably 0.07 to 0.20 μm.

[Maximum Length of White Portions and Maximum Length of Black Portions on Surface of Resin Substrate]

In the resin substrate of the present invention, the maximum length of the white portions on the surface thereof is preferably 0.704 to 0.88 μm. In addition, in the resin substrate of the present invention, the maximum length of the black portions on the surface thereof is preferably 0.180 to 0.605 μm. Here, the maximum length of the white portions indicates the maximum length (the maximum of the distances between the black portions adjacent to the respective white portions) of the measured white portions in comprehensive consideration of all the four lines (the lines A to D) shown in FIG. 1. The maximum length of the black portions indicates the maximum length (the maximum of the distances between the white portions adjacent to the respective black portions) of the measured black portions in comprehensive consideration of all the four lines (the lines A to D) shown in FIG. 1.

When the maximum length of the white portions is less than 0.704 μm, the anchor effect is weakened to result in a poor adhesion to the coating. On the other hand, when the maximum length of the white portions exceeds 0.88 μm, the asperities of the surface of the substrate are too small, and a poor adhesion to the coating is caused. The maximum length of the white portions is preferably 0.710 to 0.86 μm, more preferably 0.715 to 0.84 μm, furthermore preferably 0.715 to 0.82 μm, and furthermore preferably 0.715 to 0.80 μm.

When the maximum length of the black portions is less than 0.180 μm, the infiltration of a plating solution for forming the coating on the surface of the substrate is made difficult to result in a poor adhesion to the coating. On the other hand, when the maximum length of the black portions exceeds 0.605 μm, the anchor effect is weakened to result in a poor adhesion to the coating. The maximum length of the black portions is preferably 240 to 0.605 μm, more preferably 0.355 to 0.605 μm, furthermore preferably 0.400 to 0.590 μm, and furthermore preferably 0.420 to 0.580 μm.

[Average Size of Largest 10 White Portions and Average Size of Largest 10 Black Portions on Surface of Substrate]

In the resin substrate of the present invention, the average length of the largest 10 white portions on the surface thereof is preferably 0.15 to 0.457 μm. In the resin substrate of the present invention, the average length of the largest 10 black portions on the surface of the resin substrate is also preferably 0.06 to 0.335 μm. Here, the average length of the largest 10 white portions means the average value obtained from the sum of the 10 largest distances of the white portions, namely, the sum obtained by sequentially summing the maximum length of the white portions taken as the longest distance, the distance of the white portion having the second longest distance, the distance of the white portion having the third longest distance, and so on, ending up with the 10th longest distance of the white portion having the 10th longest distance. Here, the average length of the largest 10 black portions means the average value obtained from the sum of the 10 largest distances of the black portions, namely, the sum obtained by sequentially summing the maximum length of the black portions taken as the longest distance, the distance of the black portion having the second longest distance, the distance of the black portion having the third longest distance, and so on, ending up with the 10th longest distance of the black portion having the 10th longest distance.

When the average length of the largest 10 white portions is less than 0.15 μm, the anchor effect is weakened to result in a poor adhesion to the coating. On the other hand, when the average length of the largest 10 white portions exceeds 0.457 μm, the asperities of the surface of the substrate are too small, and a poor adhesion to the coating is caused. The average length of the largest 10 white portions is preferably 0.18 to 0.457 μm, more preferably 0.20 to 0.457 μm, furthermore preferably 0.20 to 0.45 μm, furthermore preferably 0.22 to 0.45 μm, furthermore preferably 0.30 to 0.45 μm, and furthermore preferably 0.40 to 0.45 μm.

When the average length of the largest 10 black portions is less than 0.06 μm, the infiltration of a plating solution for forming the coating on the surface of the substrate is made difficult to result in a poor adhesion to the coating. On the other hand, the average length of the largest 10 black portions exceeds 0.335 μm, the anchor effect is weakened to result in a poor adhesion to the coating. The average length of the largest 10 black portions is preferably 0.13 to 0.335 μm.

[Proportion of White Portions on Surface of Resin Substrate]

In the resin substrate of the present invention, the proportion of the white portions on the surface thereof is preferably 55 to 68%. Here, the proportion of the white portions means the proportion of the white portions in relation to the total of the white portions and the black portions. When the proportion of the white portions is less than 55%, the anchor effect is weakened to result in a poor adhesion to the coating. On the other hand, when the proportion of the white portions exceeds 68%, the asperities of the surface of the substrate are too small, and a poor adhesion to the coating is caused. The proportion of the white portions is preferably 55 to 67%, more preferably 55 to 66%, furthermore preferably 55 to 65% and furthermore preferably 55 to 64%.

[Method for Forming Surface Profile of Resin Substrate]

The profile shape of the surface of the resin substrate according to the present invention can be formed by laminating a surface-treated copper foil on the resin substrate and by subsequently removing the surface-treated copper foil concerned by entire-surface etching or the like. The profile shape of the surface of the resin substrate according to the present invention can also be formed by treating the surface of the resin substrate with a predetermined chemical solution.

In the method for forming the surface profile of the resin substrate according to the present invention, using a surface-treated copper foil, first there is prepared a surface-treated copper foil controlled so as for the area proportion (the proportion of the area corresponding to the particles) of the particles formed on the surface of the copper foil in relation to the surface of the copper foil to be 0.1 to 0.85. Next, the surface-treated copper foil concerned is bonded, via the surface-treated layer side thereof, to the resin substrate, and then the surface-treated copper foil is removed by entire-surface etching or the like. In this way, the surface profile of the resin substrate after removal of the surface-treated copper foil is formed.

There may also be used a surface-treated copper foil controlled so as for the average diameter of the particles on the surface of the surface-treated layer thereof to be 0.03 to 0.28 μm, or a surface-treated copper foil controlled so as for the number density of the particles on the surface of the surface-treated layer thereof to be 3.8 to 430 particles/μm$^2$.

In the method for forming the surface profile of the resin substrate, controlled with respect to the white portions and/or the black portions, according to the present invention, based on a treatment using a chemical solution, the surface profile can be formed by applying a desmear treatment to the resin substrate under the following immersion treatment conditions A or B, and by subsequently performing a neutralization treatment.

(Desmear Treatment Conditions A)
Desmear treatment solution: 40 g/L KMnO$_4$, 20 g/L NaOH
Treatment temperature: Room temperature
Immersion time: 20 minutes
Number of rotations of stirrer: 300 rpm
(Desmear Treatment Conditions B)
Desmear treatment solution: 90 g/L KMnO$_4$, 5 g/L HCl
Treatment temperature: 49° C.
Immersion time: 20 minutes
Number of rotations of stirrer: 300 rpm
(Neutralization Treatment Conditions)
Neutralization treatment solution: L-Ascorbic acid 80 g/L
Treatment temperature: Room temperature
Immersion time: 3 minutes
No stirring The remainders of the treatment solutions used in the desmear treatment, electrolysis, surface treatment, plating or the like used in the present invention are water unless otherwise specified.

In addition to the above-described immersion treatment, by performing shower treatments A and B, and a neutralization treatment on the surface of the resin substrate, under the following treatment conditions, it is possible to perform the formation of the surface profile, controlled with respect to the white portions and/or the black portions, of the resin substrate in the same manner as described above.

(Shower Treatment Conditions A)
Desmear treatment solution: 40 g/L KMnO4, 20 g/L NaOH
Treatment temperature: Room temperature
Treatment time: 15 minutes
Shower pressure: 0.4 MPa
(Shower Treatment Conditions B)
Desmear treatment solution: 90 g/L KMnO4, 5 g/L HCl
Treatment temperature: 49° C.
Treatment time: 20 minutes
Shower pressure: 0.4 MPa
(Neutralization Treatment Conditions)
Neutralization treatment solution: L-Ascorbic acid 80 g/L
Treatment temperature: Room temperature
Immersion time: 3 minutes
No stirring

[Surface-Treated Copper Foil]

The surface-treated copper foil of the present invention can be used for forming the surface profile of the resin substrate. The surface-treated copper foil for forming the surface profile of the resin substrate, controlled with respect to the proportion of the area corresponding to the particles, the average diameter of the particles and the number density of the particles is described. The copper foil used in the copper foil concerned may either be an electrolytic copper foil or a rolled copper foil. The thickness of the copper foil used in the present invention is not particularly required to be limited; however, the thickness of the copper foil is, for example, 1 μm or more, 2 μm or more, 3 μm or more, or 5 μm or more, and for example, 3000 μm or less, 1500 μm or less, 800 μm or less, 300 μm or less, 150 μm or less, 100 μm or less, 70 μm or less, 50 μm or less, or 40 μm or less.

Examples of the rolled copper foil used in the present invention include copper alloy foils including one or more elements such as Ag, Sn, In, Ti, Zn, Zr, Fe, P, Ni, Si, Te, Cr, Nb, V, B, and Co. When the concentration of the above-described elements is high (for example, 10% by mass or more in total), the conductivity is sometimes degraded. The conductivity of the rolled copper foil is preferably 50% IACS or more, more preferably 60% IACS or more, and furthermore preferably 80% IACS or more. Examples of the rolled copper foil include the copper foils produced by using tough pitch copper (JIS H3100 C1100) or oxygen-free copper (JIS H3100 C1020). It is to be noted that when the term "copper foil" is used alone in the present specification, the term "copper foil" also includes copper alloy foils.

The electrolytic copper foil usable in the present invention can be prepared with the following production conditions.

<Electrolyte Composition>
Copper: 90 to 110 g/L
Sulfuric acid: 90 to 110 g/L
Chlorine: 50 to 100 ppm Leveling agent 1 (bis(3-sulfopropyl)disulfide): 10 to 30 ppm Leveling agent 2 (amine compound): 10 to 30 ppm As the amine compound, an amine compound of the following chemical formula can be used.

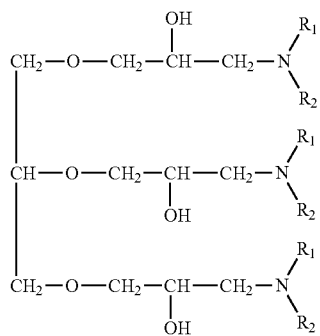

(wherein, in the chemical formula, $R_1$ and $R_2$ are each a group selected from the group consisting of a hydroxyalkyl group, an ether group, an aryl group, an aromatic-substituted alkyl group, an unsaturated hydrocarbon group, and an alkyl group.)

<Production Conditions>

Current density: 70 to 100 A/dm$^2$

Electrolyte temperature: 50 to 60° C.

Linear speed of electrolyte: 3 to 5 m/sec

Electrolysis time: 0.5 to 10 minutes

In the present invention, the surface-treated layer formed on the copper foil may be a roughening-treated layer. The roughening treatment usually means a treatment in which nodular electrodeposition is formed on the surface of a copper foil after degreasing, specifically on the copper foil surface adhering to the resin substrate, namely, the surface on the surface-treated side of the copper foil, for the purpose of improving the peel strength of the copper foil after lamination. The roughening-treated layer can be constituted by further forming a secondary particle layer after forming a primary particle layer.

The primary particle layer and the secondary particle layer are each formed of an electroplating layer. The secondary particles are characterized in that the secondary particle is one dendritic particle grown on the primary particles or the secondary particles are a plurality of dendritic particles grown on the primary particles. The secondary particles are a normal plating grown on the primary particles. In other words, when the term "secondary particle" is used in the present description, a normal plating such as a covering plating is also construed to be included. Alternatively, the secondary particle layer may be a layer having one or more layers formed of roughened particles, a layer having one or more normal plating layers, or a layer having one or more layers formed of roughened particles and one or more normal plating layers.

The primary particle layer may include copper. The secondary particle layer may include one or more selected from the group consisting of nickel and cobalt, and may include copper. The secondary particle layer may include copper, cobalt and nickel, and may include an alloy composed of copper, cobalt and nickel. When cooper is included in the primary particle layer and the secondary particle layer, there is an advantage that the productivity during manufacturing printed wiring boards is improved because the removal of the primary particle layer by etching is facilitated during forming a circuit. When cobalt or nickel is included in the secondary particle layer, there is an advantage that the peel strength between the resin and the copper foil after heating is hardly degraded.

(Plating Conditions for Forming Primary Particles)

An example of the plating conditions for the primary particles may be quoted as follows.

It is to be noted that the average diameter of the primary particles can be controlled by controlling the current density and the coulomb quantity as described above. At the first stage, the current density is set at a higher value than conventional ones, the asperities due to roughened particles are provided to some extent, the particle shape is controlled so as to be a predetermined shape, and accordingly the shape of the surface of the resin substrate obtained by removing the surface-treated copper foil after bonding the surface-treated copper foil is controlled. The surface area ratio can also be controlled. As the plating bath for forming the primary particles, in addition to the following copper plating bath, there can be quoted a silver plating bath, a gold plating bath, a nickel plating bath, a cobalt plating bath, a zinc plating bath, a nickel-zinc alloy plating bath, and the like; these heretofore known plating baths can be used. To the plating solutions, various additives (metal ions, inorganic substances, organic substances) may be added. The linear speed of the plating solution during the formation of the primary particles is set at a slightly higher value than the conventional ones, and is controlled in such a way that the asperities due to roughened particles are not too large, and the particle shape is a predetermined shape; and accordingly, the shape of the surface of the resin substrate obtained by removing the surface-treated copper foil after bonding the surface-treated copper foil is controlled. The linear speed of the plating solution during the formation of the primary particles is preferably 2.0 m/sec or more and more preferably 2.5 m/sec or more. The upper limit of the linear speed of the plating solution during the formation of the primary particles is not particularly required to be set; however, the upper limit concerned is typically 5 m/sec or less and typically 4.5 m/sec or less.

Solution composition: Copper: 10 to 20 g/L, sulfuric acid: 50 to 100 g/L

Solution temperature: 25 to 50° C.

<First Stage>

Current density: 68 to 80 A/dm$^2$

Coulomb quantity: 30 to 75 As/dm$^2$

<Second Stage>

Current density: 1 to 20 A/dm$^2$

Coulomb quantity: 5 to 50 As/dm$^2$ (Covering Plating Conditions)

To the plating solutions, various additives (metal ions, inorganic substances, organic substances) may be added.

Solution composition: Copper: 10 to 20 g/L, sulfuric acid: 50 to 100 g/L

Solution temperature: 25 to 35° C.

Current density: 15 to 20 A/dm$^2$

Coulomb quantity: 30 to 60 As/dm$^2$ (Plating Conditions for Forming Secondary Particles)

An example of the plating conditions for the secondary particles may be quoted as follows.

It is to be noted that the average diameter of the secondary particles can be controlled by controlling the current density and the coulomb quantity as described below. The surface area ratio can also be controlled. As the plating bath for forming the secondary particles, in addition to the following copper-another or other elements alloy plating bath, there can be quoted a silver-another or other elements alloy plating bath, a gold-another or other elements alloy plating bath, a nickel-another or other elements alloy plating bath, a cobalt-another or other elements alloy plating bath, a zinc-another or other elements alloy plating bath and a nickel-zinc alloy plating bath; these heretofore known plating baths can be used.

To the plating solutions, various additives (metal ions, inorganic substances, organic substances) may be added.

Solution composition: Copper: 10 to 20 g/L, nickel: 5 to 15 g/L and/or cobalt: 5 to 15 g/L; when phosphorus is included, phosphorus: 0.5 to 5 g/L, when tungsten is included, tungsten: 0.001 to 5 g/L, when molybdenum is included, molybdenum: 0.05 to 10 g/L pH: 2 to 3
Solution temperature: 30 to 50° C.
Current density: 20 to 30 A/dm$^2$
Coulomb quantity: 10 to 35 As/dm$^2$ A copper-cobalt-nickel alloy plating as the secondary particles can form a ternary alloy layer, by an electrolytic plating, having the following deposition amounts: 10 to 30 mg/dm$^2$ of copper, 100 to 3000 μg/dm$^2$ of cobalt and 50 to 500 μg/dm$^2$ of nickel.

When the Co deposition amount is less than 100 μg/dm$^2$, the heat resistance is degraded and the etching property is also degraded. When the Co deposition amount exceeds 3000 μg/dm$^2$, such a deposition amount is not favorable in the case where magnetic effect is required to be considered, causes etching stain, and the degradation of acid resistance and the degradation of chemical resistance can be considered.

When the Ni deposition amount is less than 50 μg/dm$^2$, the heat resistance is degraded. On the other hand, when the Ni deposition amount exceeds 500 μg/dm$^2$, the etching property is degraded. Specifically, etching residue occurs, and fine pattern formation is made difficult although not to a level that etching cannot be implemented. A preferable Co deposition amount is 500 to 2000 μg/dm$^2$, and a preferable nickel deposition amount is 50 to 300 μg/dm$^2$.

From the above description, the following deposition amounts in the copper-cobalt-nickel alloy plating can be said to be desirable: 10 to 30 mg/dm$^2$ of copper, 100 to 3000 μg/dm$^2$ of cobalt and 50 to 500 μg/dm$^2$ of nickel. The respective deposition amounts of the ternary alloy layer are only desirable conditions, and do not deny a range that exceeds these amounts.

Here, the etching stain means that Co remains undissolved in etching with copper chloride, and the etching residue means that Ni remains undissolved in alkaline etching with ammonium chloride.

In general, when a circuit is formed, the circuit formation is performed by using such an alkaline etching solution and a copper chloride-based etching solution as described in following Examples. These etching solutions and the etching conditions have versatility, but it should be construed that the etching solutions and the etching conditions can be optionally selected without being limited to the mentioned etching solutions and etching conditions.

Additionally, on the surface of the roughening-treated layer, one or more layers selected from the group consisting of a heat resistant layer, a rust-preventing layer, a chromate-treated layer and a silane coupling treated layer may be formed.

In the present invention, the surface-treated layer formed on the copper foil may be one or more selected from the group consisting of a heat resistant layer, a rust-preventing layer, a chromate-treated layer and a silane coupling treated layer.

As the heat resistant layer and the rust-preventing layer, heretofore known heat resistant layers and rust-preventing layers can be used. For example, the heat resistant layer and/or the rust-preventing layer may be a layer including one or more elements selected from the group consisting of nickel, zinc, tin, cobalt, molybdenum, copper, tungsten, phosphorus, arsenic, chromium, vanadium, titanium, aluminum, gold, silver, platinum group elements, iron and tantalum; or a metal layer or an alloy layer composed of one or more elements selected from the group consisting of nickel, zinc, tin, cobalt, molybdenum, copper, tungsten, phosphorus, arsenic, chromium, vanadium, titanium, aluminum, gold, silver, platinum group elements, iron and tantalum. The heat resistant layer and/or the rust-preventing layer may also include an oxide, a nitride and a silicide including one or more elements selected from the group consisting of nickel, zinc, tin, cobalt, molybdenum, copper, tungsten, phosphorus, arsenic, chromium, vanadium, titanium, aluminum, gold, silver, platinum group elements, iron and tantalum. The heat resistant layer and/or the rust-preventing layer may also be a layer including a nickel-zinc alloy. The heat resistant layer and/or the rust-preventing layer may also be a nickel-zinc alloy layer. The nickel-zinc alloy layer may be a layer containing 50 wt % to 99 wt % of nickel and 50 wt % to 1 wt % of zinc, zinc, except for inevitable impurities. The total deposition amount of zinc and nickel in the nickel-zinc alloy layer may be 5 to 1000 mg/m$^2$, preferably 10 to 500 mg/m$^2$, and preferably 20 to 100 mg/m$^2$. The ratio (=deposition amount of nickel/deposition amount of zinc) between the deposition amount of nickel and the deposition amount of zinc in the nickel-zinc alloy-containing layer or the nickel-zinc alloy layer is preferably 1.5 to 10. The deposition amount of nickel in the layer including a nickel-zinc alloy or the nickel-zinc alloy layer is preferably 0.5 mg/m$^2$ to 500 mg/m$^2$, and more preferably 1 mg/m$^2$ to 50 mg/m$^2$. In the case where the heat resistant layer and/or the rust-preventing layer is a layer including a nickel-zinc alloy, when the inner wall portion of the through-holes, the via holes or the like is brought into contact with the desmear solution, the interface between the copper foil and the resin substrate is hardly corroded by the desmear solution, and the adhesion between the copper foil and the resin substrate is improved.

For example, the heat resistant layer and/or the rust-preventing layer may be a layer formed by sequentially laminating a nickel or nickel alloy layer having a deposition amount of 1 mg/m$^2$ to 100 mg/m$^2$, preferably 5 mg/m$^2$ to 50 mg/m$^2$ and a tin layer having a deposition amount of 1 mg/m$^2$ to 80 mg/m$^2$, preferably 5 mg/m$^2$ to 40 mg/m$^2$, and the nickel alloy layer may be constituted with any one of a nickel-molybdenum alloy, a nickel-zinc alloy, and a nickel-molybdenum-cobalt alloy. In the heat resistant layer and/or the rust-preventing layer, the total deposition amount of nickel or a nickel alloy and tin is preferably 2 mg/m$^2$ to 150 mg/m$^2$ and more preferably 10 mg/m$^2$ to 70 mg/m$^2$. In the heat resistant layer and/or the rust-preventing layer, [nickel deposition amount in the nickel or the nickel alloy]/[tin deposition amount] is preferably 0.25 to 10 and more preferably 0.33 to 3. By using the heat resistant layer concerned and/or the rust-preventing layer, after the processing of the copper foil with carrier into a printed wiring board, the peel strength of the circuit, the degradation rate of the chemical resistance of the peel strength concerned and the like are made satisfactory.

For the silane coupling agent used in the silane coupling treatment, heretofore known silane coupling agents may be used; for example, an amino silane coupling agent, an epoxy silane coupling agent, or a mercapto silane coupling agent may also be used. As the silane coupling agent, for example, the following compounds may be used: vinyltrimethoxysilane, vinylphenyltrimethoxysilane, γ-methacryloxypropyltrimethoxysilane, γ-glycidoxypropyltrimethoxysilane, 4-glycidylbutyltrimethoxysilane, γ-aminopropyltriethoxysilane, N-β(aminoethyl)-γ-aminopropyltrimethoxysilane, N-3-(4-(3-aminopropoxy)butoxy)propyl-3-aminopropyltrimethoxysilane, imidazolesilane, triazinesilane, and γ-mercaptopropyltrimethoxysi lane.

The silane coupling treated layer may be formed by using, for example, a silane coupling agent such as an epoxy silane, an amino silane, a methacryloxy silane and a mercapto silane. Such silane coupling agents may also be used as mixtures of two or more thereof. The silane coupling treated layer is preferably a layer formed by using, among these, an amino silane coupling agent or an epoxy silane coupling agent.

The amino silane coupling agent as referred to herein may be an amino silane coupling agent selected from the group consisting of N-(2-aminoethyl)-3-aminopropyltrimethoxysilane, 3-(N-styrylmethyl-2-aminoethylamino)propyltrimethoxysilane, 3-aminopropyltriethoxysilane, bis(2-hydroxyethyl)-3-aminopropyltriethoxysilane, aminopropyltrimethoxysilane, N-methylaminopropyltrimethoxysilane, N-phenylaminopropyltrimethoxysilane, N-(3-acryloxy-2-hydroxypropyl)-3-aminopropyltriethoxysilane, 4-aminobutyltriethoxysilane, (aminoethylaminomethyl)phenetyltrimethoxysilane, N-(2-aminoethyl-3-aminopropyl)trimethoxysilane, N-(2-aminoethyl-3-aminopropyl) tris(2-ethylhexoxy)silane, 6-(aminohexylaminopropyl)trimethoxysilane, aminophenyltrimethoxysilane, 3-(1-aminopropoxy)-3,3-dimethyl-1-propenyltrimethoxysilane, 3-aminopropyltris(methoxyethoxy)silane, 3-aminopropyltriethoxysilane, 3-aminopropyltrimethoxysilane, ω-aminoundecyltrimethoxysilane, 3-(2-N-benzylaminoethylaminopropyl)trimethoxysilane, bis(2-hydroxyethyl)-3-aminopropyltriethoxysilane, (N,N-diethyl-3-aminopropyl) trimethoxysilane, (N,N-dimethyl-3-aminopropyl) trimethoxysilane, N-methylaminopropyltrimethoxysilane, N-phenylaminopropyltrimethoxysilane, 3-(N-styrylmethyl-2-aminoethylamino)propyltrimethoxysilane, γ-aminopropyltriethoxysilane, N-β(aminoethyl)-γ-aminopropyltrimethoxysilane, and N-3-(4-(3-aminopropoxy)butoxy)propyl-3-aminopropyltrimethoxysilane.

It is desirable that the silane coupling treated layer be formed with an area density falling in the following ranges, in terms of silicon atom: a range from 0.05 mg/m² to 200 mg/m², preferably a range from 0.15 mg/m² to 20 mg/m², and preferably a range from 0.3 mg/m² to 2.0 mg/m². In the case of the foregoing ranges, the adhesion between the substrate and the surface-treated copper foil can be more improved.

[Proportion of Area Corresponding to Particle of Surface-Treated Copper Foil]

In the surface-treated copper foil of the present invention, the area proportion of the particles formed on the surface of the copper foil (the proportion of the area corresponding to the particles) in relation to the surface of the copper foil is controlled so as to be 0.1 to 0.85. The profile shape of the substrate surface, after bonding to the substrate surface the surface-treated copper foil controlled as described above with respect to the proportion of the area corresponding to the particles and subsequently removing the copper foil by etching, maintains the fine wiring formability more satisfactorily, and achieves the satisfactory adhesion of the electroless copper plating coating. When the proportion of the area corresponding to the particles is less than 0.1, the asperity shape transferred to the surface of the substrate is too small, and a poor adhesion to the coating is caused. On the other hand, when the proportion of the area corresponding to the particles exceeds 0.7, the asperity shape transferred to the surface of the substrate is too large, and a poor fine wiring formability of the surface of the substrate is caused. The proportion of the area corresponding to the particles is preferably 0.10 to 0.70, 0.15 to 0.70, more preferably 0.20 to 0.65, and furthermore preferably 0.25 to 0.60.

[Average Diameter of Particles of Surface-Treated Copper Foil]

In the surface-treated copper foil of the present invention, the average diameter of the particles on the surface of the surface-treated layer is preferably controlled so as to be 0.03 to 0.28 μm. The profile shape of the substrate surface, after bonding to the substrate surface the surface-treated copper foil controlled as described above with respect to the average diameter of the particles on the surface of the surface-treated layer and subsequently removing the copper foil by etching, maintains the fine wiring formability more satisfactorily, and achieves a satisfactory adhesion of the electroless copper plating coating. When the average diameter of the particles on the surface of the surface-treated layer is less than 0.05 μm, the asperity shape transferred to the surface of the substrate is too small, and a poor adhesion to the coating is caused. On the other hand, when the average diameter of the particles on the surface of the surface-treated layer exceeds 0.28 μm, the asperity shape transferred to the surface of the substrate is too large, and a poor fine wiring formability of the surface of the substrate is caused. The average diameter of the particles on the surface of the surface-treated layer is preferably 0.05 to 0.28 μm, more preferably 0.07 to 0.27 μm, furthermore preferably 0.08 to 0.25 μm, 0.12 to 0.24 μm, 0.15 to 0.24 μm, and 0.19 to 0.23 μm.

[Number Density of Particles of Surface-Treated Copper Foil]

In the surface-treated copper foil of the present invention, the number density of the particles on the surface of the surface-treated layer is preferably controlled so as to be 3.8 to 430 particles/μm². The profile shape of the substrate surface, after bonding to the substrate surface the surface-treated copper foil controlled as described above with respect to the number density of the particles on the surface of the surface-treated layer and subsequently removing the copper foil by etching, maintains the fine wiring formability more satisfactorily, and achieves a satisfactory adhesion of the electroless copper plating coating. When the number density of the particles on the surface of the surface-treated layer is less than 3.8 particles/μm², the asperity shape transferred to the surface of the substrate is too small, and a poor adhesion to the coating is caused. On the other hand, when the number density of the particles on the surface of the surface-treated layer exceeds 430.0 particles/μm², the asperity shape transferred to the surface of the substrate is too large, and a poor fine wiring formability of the surface of the substrate is caused. The number density of the particles on the surface of the surface-treated layer is preferably controlled so as to be 4.0 to 300 particles/μm², 4.5 to 250 particles/μm², 5.0 to 200 particles/μm², 5.0 to 150 particles/μm², 5.5 to 100 particles/μm², 5.5 to 50.0 particles/μm², 6.0 to 48.0 particles/μm², 6.0 to 32.0 particles/μm², 3.8 to 16.0 particles/μm², 6.0 to 16.0 particles/μm², 6.0 to 14.0 particles/μm².

[Average Length of White Portions and Average Length of Black Portions]

In the surface-treated copper foil of the present invention, when a surface-treated copper foil is bonded, via the surface-treated layer side thereof, to a resin substrate, and the surface-treated copper foil is removed, the average length of the white portions on the surface, on the copper foil removal side, of the resin substrate is preferably 0.07 to 0.23 µm. In the surface-treated copper foil of the present invention, when a surface-treated copper foil is bonded, via the surface-treated layer side thereof, to a resin substrate, and the surface-treated copper foil is removed, the average length of the black portions on the surface, on the copper foil removal side, of the substrate is preferably 0.035 to 0.20 µm.

When the average length of the white portions is less than 0.07 µm, the anchor effect is weakened to result in a poor adhesion to the coating. On the other hand, when the average length of the white portions exceeds 0.23 µm, the asperities of the surface of the substrate are too small, and a poor adhesion to the coating is caused. The average length of the white portions is preferably 0.09 to 0.23 µm, more preferably 0.12 to 0.23 µm, furthermore preferably 0.14 to 0.23 µm, furthermore preferably 0.15 to 0.225 µm, and 0.16 to 0.220 µm.

When the average length of the black portions is less than 0.035 µm, the infiltration of a plating solution for forming the coating on the surface of the substrate is made difficult to result in a poor adhesion to the coating. On the other hand, when the average length of the black portions exceeds 0.20 µm, the anchor effect is weakened to result in a poor adhesion to the coating. The average length of the black portions is preferably 0.05 to 0.20 µm and more preferably 0.07 to 0.20 µm.

[Maximum Length of White Portions and Maximum Length of Black Portions]

In the surface-treated copper foil of the present invention, when a surface-treated copper foil is bonded, via the surface-treated layer side thereof, to a resin substrate, and the surface-treated copper foil is removed, the maximum length of the white portions on the surface, on the copper foil removal side, of the resin substrate is preferably 0.704 to 0.88 µm. In addition, in the surface-treated copper foil of the present invention, when a surface-treated copper foil is bonded, via the surface-treated layer side thereof, to a resin substrate, and the surface-treated copper foil is removed, the maximum length of the black portions on the surface, on the copper foil removal side, of the resin substrate is preferably 0.180 to 0.605 µm. Here, the maximum length of the white portions indicates the maximum length (the maximum of the distances between the black portions adjacent to the respective white portions) of the measured white portions in comprehensive consideration of all the four lines (the lines A to D) shown in FIG. 1. In addition, the maximum length of the black portions indicates the maximum length (the maximum of the distances between the white portions adjacent to the respective black portions) of the measured black portions in comprehensive consideration of all the four lines (the lines A to D) shown in FIG. 1.

When the maximum length of the white portions is less than 0.704 µm, the anchor effect is weakened to result in a poor adhesion to the coating. On the other hand, when the maximum length of the white portions exceeds 0.88 µm, the asperities of the surface of the substrate are too small, and a poor adhesion to the coating is caused. The maximum length of the white portions is preferably 0.710 to 0.86 µm, more preferably 0.715 to 0.84 µm, furthermore preferably 0.715 to 0.82 µm, and furthermore preferably 0.715 to 0.80 µm.

When the maximum length of the black portions is less than 0.180 µm, the infiltration of a plating solution for forming the coating on the surface of the substrate is made difficult to result in a poor adhesion to the coating. On the other hand, when the maximum length of the black portions exceeds 0.605 µm, the anchor effect is weakened to result in a poor adhesion to the coating. The maximum length of the black portions is preferably 240 to 0.605 µm, more preferably 0.355 to 0.605 µm, furthermore preferably 0.400 to 0.590 µm, and furthermore preferably 0.420 to 0.580 µm.

[Average Size of Largest 10 White Portions and Average Size of Largest 10 Black Portions]

In the surface-treated copper foil of the present invention, when a surface-treated copper foil is bonded, via the surface-treated layer side thereof, to a resin substrate, and the surface-treated copper foil is removed, the average length of the largest 10 white portions on the surface, on the copper foil removal side, of the resin substrate is preferably 0.15 to 0.457 µm. In addition, in the surface-treated copper foil of the present invention, when a surface-treated copper foil is bonded, via the surface-treated layer side thereof, to a resin substrate, and the surface-treated copper foil is removed, the average length of the largest 10 black portions on the surface, on the copper foil removal side, of the resin substrate is preferably 0.06 to 0.335 µm. Here, the average length of the largest 10 white portions means the average value obtained from the sum of the 10 largest distances of the white portions, namely, the sum obtained by sequentially summing the maximum length of the white portions taken as the longest distance, the distance of the white portion having the second longest distance, the distance of the white portion having the third longest distance, and so on, ending up with the 10th longest distance of the white portion having the 10th longest distance. Here, the average length of the largest 10 black portions means the average value obtained from the sum of the 10 largest distances of the black portions, namely, the sum obtained by sequentially summing the maximum length of the black portions taken as the longest distance, the distance of the black portion having the second longest distance, the distance of the black portion having the third longest distance, and so on, ending up with the 10th longest distance of the black portion having the 10th longest distance.

When the average length of the largest 10 white portions is less than 0.15 µm, the anchor effect is weakened to result in a poor adhesion to the coating. On the other hand, when the average length of the largest 10 white portions exceeds 0.457 µm, the asperities of the surface of the substrate are too small, and a poor adhesion to the coating is caused. The average length of the largest 10 white portions is preferably 0.18 to 0.457 µm, more preferably 0.20 to 0.457 µm, furthermore preferably 0.20 to 0.45 µm, furthermore preferably 0.22 to 0.45 µm, furthermore preferably 0.30 to 0.45 µm, and furthermore preferably 0.40 to 0.45 µm.

When the average length of the largest 10 black portions is less than 0.06 µm, the infiltration of a plating solution for forming the coating on the surface of the substrate is made difficult to result in a poor adhesion to the coating. On the other hand, when the average length of the largest 10 black portions exceeds 0.335 µm, the anchor effect is weakened to result in a poor adhesion to the coating. The average length of the largest 10 black portions is preferably 0.13 to 0.335 µm.

[Proportion of White Portions]

In the surface-treated copper foil of the present invention, when a surface-treated copper foil is bonded, via the surface-treated layer side thereof, to a resin substrate, and the surface-treated copper foil is removed, the proportion of the white portions on the surface, on the copper foil removal side, of the resin substrate is preferably 55 to 68%. Here, the proportion of the white portions means the proportion of the white portions in relation to the total of the white portions and the black portions. When the proportion of the white portions is less than 55%, the anchor effect is weakened to result in a poor adhesion to the coating. On the other hand, when the proportion of the white portions exceeds 68%, the asperities of the surface of the substrate are too small, and a poor adhesion to the coating is caused. The proportion of the white portions is preferably 55 to 67%, more preferably 55 to 66%, furthermore preferably 55 to 65%, and furthermore preferably 55 to 64%.

By controlling the current density and the plating time for surface treatment during the surface treatment such as during the formation of roughened particles, the surface state of the copper foil and the form and the formation density of roughened particles, after the surface treatment are determined, the proportion of the area corresponding to the particles, the average diameter of the particles and the number density of the particles of the copper foil can be controlled, and moreover, by using such a copper foil, the white portions and the black portions of the substrate can be controlled.

[Copper Foil with Carrier]

As the surface-treated copper foil according to the present invention, a copper foil with carrier may also be used. The copper foil with carrier includes a carrier, an intermediate layer laminated on the carrier, and an ultra-thin copper layer laminated on the intermediate layer. Alternatively, the copper foil with carrier may include a carrier, an intermediate layer and an ultra-thin copper layer, in this order. The copper foil with carrier may have a surface-treated layer such as a roughening-treated layer on one of or each of both of the surface on the carrier side and the surface on the ultra-thin copper layer side. The copper foil with carrier may also have a surface-treated layer on the surface, on the side opposite to the intermediate layer side, of the ultra-thin copper layer.

In the case where a roughening-treated layer is provided on the surface on the carrier side of the copper foil with carrier, when the copper foil with carrier is laminated, via the surface side thereof on the carrier side concerned, on s support such as a resin substrate, the copper foil with carrier has an advantage that the carrier and the support such as a substrate are hardly peeled from each other.

<Carrier>

Copper foil is used as a carrier which can be used in the present invention. The carrier is typically provided in the form of a rolled copper foil or an electrolytic copper foil. In general, electrolytic copper foil is produced by electrolytically depositing copper on a titanium or stainless steel drum from a copper sulfate plating bath, and rolled copper foil is produced by repeating plastic working and heat treatment with a rolling roll. As the material for the copper foil, there can be used, in addition to high purity copper such as tough pitch copper and oxygen-free copper, for example, Sn-containing copper, Ag-containing copper, copper alloy with Cr, Zr, Mg or the like added thereto, and copper alloys such as Corson alloys with Ni, Si and the like added thereto.

The thickness of the carrier usable in the present invention is not particularly limited; the thickness concerned can be appropriately regulated to be a thickness suitable for achieving the role as the carrier, and the thickness concerned is allowed to be 12 μm or more. However, the thickness concerned is too thick, the production cost is increased, and hence, in general, it is preferable to set the thickness to be 35 μm or less. Accordingly, the thickness of the carrier is typically 12 to 70 μm, and more typically 18 to 35 μm.

<Intermediate Layer>

On the carrier, the intermediate layer is provided. Between the carrier and the intermediate layer, another layer may be provided. The intermediate layer used in the present invention is not particularly limited as long as the intermediate layer has a constitution such that the ultra-thin copper layer is hardly peeled from the carrier before the step of laminating the copper foil with carrier on the insulating substrate, and on the other hand, after the step of laminating on the insulating substrate, the ultra-thin copper layer is allowed to be peeled from the carrier. For example, the intermediate layer of the copper foil with carrier of the present invention may include one or two or more selected from the group consisting of Cr, Ni, Co, Fe, Mo, Ti, W, P, Cu, Al, Zn, alloys of these, hydrates of these, oxides of these and organic substances. In addition, the intermediate layer maybe composed of two or more layers.

For example, the intermediate layer can be constituted by forming, from the carrier side, a single metal layer composed of one element selected from the element group constituted with one element selected from the group consisting of Cr, Ni, Co, Fe, Mo, Ti, W, P, Cu, Al and Zn, or an alloy layer composed of one or two or more elements selected from the element group consisting of Cr, Ni, Co, Fe, Mo, Ti, W, P, Cu, Al and Zn, and by forming, on the single metal layer of the alloy layer, a layer composed of hydrates or oxides of one or two or more elements selected from the element group consisting of Cr, Ni, Co, Fe, Mo, Ti, W, P, Cu, Al and Zn.

In addition, for example, the intermediate layer can be constituted by laminating, on the carrier, nickel, a nickel-phosphorus alloy or a nickel-cobalt alloy, and chromium in this order. The adhesion between nickel and copper is higher than the adhesion between chromium and copper, and hence, when the ultra-thin copper layer is peeled, peeling occurs between the ultra-thin copper layer and chromium. For the nickel in the intermediate layer, the barrier effect to prevent the diffusion of the copper component from the carrier to the ultra-thin copper layer is expected. The deposition amount of nickel in the intermediate layer is preferably 100 μg/dm$^2$ or more and 40000 μg/dm$^2$ or less, more preferably 100 μg/dm$^2$ or more and 4000 μg/dm$^2$ or less, more preferably 100 μg/dm$^2$ or more and 2500 μg/dm$^2$ or less, and more preferably 100 μg/dm$^2$ or more and 1000 μg/dm$^2$ or less; the deposition amount of chromium in the intermediate layer is preferably 5 μg/dm$^2$ or more and 100 μg/dm$^2$ or less. When the intermediate layer is provided only on one side, it is preferable to provide a rust-preventing layer such as a Ni plating layer carrier on the opposite side of the carrier. On both sides of the carrier, the intermediate layers may also be provided.

<Ultra-Thin Copper Layer>

On the intermediate layer, the ultra-thin copper layer is provided. Another layer may also be provided between the intermediate layer and the ultra-thin copper layer. The ultra-thin copper layer concerned is the above-described surface-treated copper foil, and has the surface-treated layer provided on the surface, opposite to the intermediate layer, of the ultra-thin copper layer. The thickness of the ultra-thin copper layer is not particularly limited, but is generally thinner than the carrier, and for example, 12 μm or less. The thickness of the ultra-thin copper layer is typically 0.5 to 12 µm and more typically 1.5 to 5 µm. In addition, before the ultra-thin copper layer is provided on the intermediate layer, a strike plating using a copper-phosphorus alloy may be performed in order to reduce the pin-holes of the ultra-thin copper layer. For the strike plating, for example, a copper pyrophosphate plating solution may be cited. On both sides of the carrier, ultra-thin copper layers may also be provided.

[Resin Layer on Surface-Treated Layer]

A resin layer may also be provided on the surface-treated layer of the above-described surface-treated copper foil. The resin layer may be an insulating resin layer.

The resin layer may be an adhesive, or an insulating resin layer of a semi-cured state (B stage state) for adhesion. The semi-cured state (B stage state) includes a state in which no sticky feeling is sensed when the finger is in contact with the surface, the insulating resin layer can be stored in a state of being superposed, and moreover, curing reaction occurs when undergoing heat treatment.

The resin layer may include a thermocuring resin or may be a thermoplastic resin. The resin layer may include a thermoplastic resin. The type of the above-described resin is not particularly limited; examples of the suitable resins include: epoxy resin, polyimide resin, multifunctional cyanic acid ester compound, maleimide compound, maleimide-based resin, polyvinylacetal resin, urethane resin, polyether sulfone, polyether sulfone resin, aromatic polyamide resin, polyamideimide resin, rubber-modified epoxy resin, phenoxy resin, carboxyl group-modified acrylonitrile-butadiene resin, polyphenylene oxide, bismaleimide triazine resin, thermocuring polyphenylene oxide resin, cyanate ester-based resin, and polybasic carboxylic acid anhydride-containing resin. The resin layer may be a resin layer including a block copolymerized polyimide resin layer, or a resin layer including a block copolymerized polyimide resin and a polymaleimide compound. The epoxy resin can be used without causing any particular problem as long as the epoxy resin has two or more epoxy groups in the molecule thereof, and can be used for the application to electric-electronic material. The epoxy resin is preferably an epoxy resin obtained by epoxidation by using a compound having two or more glycidyl groups in the molecule of the compound. As the epoxy resin, one or mixtures of two or more selected from the group consisting of bisphenol A-type epoxy resin, bisphenol F-type epoxy resin, bisphenol S-type epoxy resin, bisphenol AD-type epoxy resin, novolac type epoxy resin, cresol novolac type epoxy resin, alicyclic epoxy resin, brominated epoxy resin, glycidylamine-type epoxy resin, triglycidyl isocyanurate, glycidylamine compounds such as N,N-diglycidylaniline, glycidyl ester compounds such as tetrahydrophthalic acid diglycidyl ester, phosphorus-containing epoxy resin, biphenyl-type epoxy resin, biphenyl novolac type epoxy resin, tris-hydroxyphenylmethane-type epoxy resin, and tetraphenyl methane-type epoxy resin; or alternatively, the hydrogenated products or the halogenated products of the above-described epoxy resins can also be used.

The resin layer may include heretofore known resins, resin curing agents, compounds, curing promoters, dielectrics (any dielectrics such as dielectrics including inorganic compounds and/or organic compounds, or dielectrics including metal oxides may be used), reaction catalysts, cross-linking agents, polymers, prepregs, skeletal materials and the like. The resin layer may be formed by using the substances (resins, resin curing agents, compounds, curing promoters, dielectrics, reaction catalysts, cross-linking agents, polymers, prepregs, skeletal materials and the like) and/or the methods for forming resin layers, and the apparatuses for forming resin layers described in the following documents: International Publication No. WO 2008/004399, International Publication No. WO 2008/053878, International Publication No. WO 2009/084533, Japanese Patent Laid-Open No. 11-5828, Japanese Patent Laid-Open No. 11-140281, Japanese Patent No. 3184485, International Publication No. WO 97/02728, Japanese Patent No. 3676375, Japanese Patent Laid-Open No. 2000-43188, Japanese Patent No. 3612594, Japanese Patent Laid-Open No. 2002-179772, Japanese Patent Laid-Open No. 2002-359444, Japanese Patent Laid-Open No. 2003-304068, Japanese Patent No. 3992225, Japanese Patent Laid-Open No. 2003-249739, Japanese Patent No. 4136509, Japanese Patent Laid-Open No. 2004-82687, Japanese Patent No. 4025177, Japanese Patent Laid-Open No. 2004-349654, Japanese Patent No. 4286060, Japanese Patent Laid-Open No. 2005-262506, Japanese Patent No. 4570070, Japanese Patent Laid-Open No. 2005-53218, Japanese Patent No. 3949676, Japanese Patent No. 4178415, International Publication No. WO 2004/005588, Japanese Patent Laid-Open No. 2006-257153, Japanese Patent Laid-Open No. 2007-326923, Japanese Patent Laid-Open No. 2008-111169, Japanese Patent No. 5024930, International Publication No. WO 2006/028207, Japanese Patent No. 4828427, Japanese Patent Laid-Open No. 2009-67029, International Publication No. WO 2006/134868, Japanese Patent No. 5046927, Japanese Patent Laid-Open No. 2009-173017, International Publication No. WO 2007/105635, Japanese Patent No. 5180815, International Publication No. WO 2008/114858, International Publication No. WO 2009/008471, Japanese Patent Laid-Open No. 2011-14727, International Publication No. WO 2009/001850, International Publication No. WO 2009/145179, International Publication No. WO 2011/068157, Japanese Patent Laid-Open No. 2013-19056.

Resin solutions are prepared by dissolving these resins in the solvents such as methyl ethyl ketone (MEK), cyclopentanone, dimethyl formamide, dimethyl acetamide, N-methylpyrrolidone, toluene, methanol, ethanol, propylene glycol monomethyl ether, dimethyl formamide, dimethyl acetamide, cyclohexanone, ethyl cellosolve, N-methyl-2-pyrrolidone, N,N-dimethyl acetamide, and N,N-dimethyl formamide; these resin solutions are applied to the ultra-thin copper layer, or the heat resistant layer, the rust-preventing layer, the chromate-treated layer, or the silane coupling agent layer by, for example, a roll coater method, successively heat-dried, if necessary, to remove the solvent to form a B-stage state. For the drying, for example, a hot air drying furnace may be used, and the drying temperature may be 100 to 250° C., and preferably 130 to 200° C. The composition of the resin layer may be dissolve by using a solvent, to prepare a resin solution having a resin solid content of 3 wt % to 60 wt %, preferably 10 wt % to 40 wt %, and more preferably 25 wt % to 40 wt %. The dissolution by using a mixed solvent composed of methyl ethyl ketone and cyclopentanone is mot preferable at the present stage from an environmental viewpoint.

The surface-treated copper foil provided with the resin layer (surface-treated copper foil with resin) is used in a mode in which the resin layer of the copper foil is superposed on the substrate, then the whole is thermally compression bonded to thermally cure the resin layer, and successively a predetermined wiring pattern is formed on the copper foil. For the copper foil with carrier using the surface-treated copper foil concerned as the ultra-thin copper layer, the copper foil with carrier provided with the resin layer (copper foil with carrier with resin) is used in a mode in which the resin layer of the copper foil is superposed on the substrate, then the whole is thermally compression bonded to thermally cure the resin layer, successively the carrier is peeled to expose the ultra-thin copper layer (naturally, the exposed face is the surface on the intermediate layer side of the ultra-thin copper layer), and a predetermined wiring patter is formed on the exposed ultra-thin copper layer.

When the surface-treated copper foil with resin or the copper foil with resin and carrier is used, it is possible to reduce the number of sheets of prepreg material used during the production of a multilayer printed wiring board. Moreover, it is possible to produce a copper clad laminate when the thickness of the resin layer is allowed to be a thickness capable of ensuring interlayer insulation, or even when no prepreg material is used at all. In this case, it is also possible to further improve the smoothness of the surface of the substrate by undercoating an insulating resin on the surface of the substrate.

When no prepreg material is used, the material cost for the prepreg material can be saved, the laminating step is made simple, thus, economic advantage is provided, the thickness of the produced multilayer printed wiring board is made thinner by the thickness of the prepreg material, and in particular, in the case of a copper foil with resin and carrier, there is provided an advantage that an ultra-thin multilayer printed wiring board having a thickness of one layer of 100 µm or less can be produced. The thickness of the resin layer concerned is preferably 0.1 to 120 µm.

When the thickness of the resin layer is thinner than 0.1 µm, the adhesion is degraded; when the surface-treated copper foil with resin or the copper foil with resin and carrier is laminated on a substrate having an inner layer material, it is sometimes difficult to ensure the inter layer insulation with the circuit of the inner layer material. The total resin layer thickness of the cured resin layer and the semi-cured resin layer is preferably 0.1 µm to 120 µm and practically preferably 35 µm to 120 µm. In such a case, it is preferable that the thickness of the cured resin layer be 5 to 20 µm, and the thickness of the semi-cured resin layer be 15 to 115 µm. This is because when the total resin layer thickness exceeds 120 µm, it is sometimes difficult to produce a thin multilayer printed wiring board; and when the total resin layer thickness is less than 35 µm, although it is easy to form a thin multilayer printed wiring board, the resin layer as the insulating layer between the circuits in the inner layers is too thin, and the insulation between the circuits of the inner layers sometimes tends to be made unstable. When the thickness of the cured resin layer is less than 5 µm, it is sometimes necessary to consider the surface roughness degree of the roughened surface of the copper foil. On the contrary, when the thickness of the cured resin layer exceeds 20 µm, the effect due to the cured resin layer is sometimes not particularly improved, and the total thickness is thick. The cured resin layer may be 3 µm to 30 µm in thickness. The semi-cured resin layer may be 7 µm to 55 µm in thickness. The total thickness of the cured resin layer and the semi-cured resin layer may be 10 µm to 60 µm.

When the surface-treated copper foil with resin or the copper foil with resin and carrier is used in the production of an ultra-thin multilayer printed wiring board, it is preferable for the purpose of reducing the thickness of the multilayer printed wiring board that the thickness of the resin layer be set to be 0.1 µm to 5 µm, more preferably 0.5 µm to 5 µm, and more preferably 1 µm to 5 µm. When the thickness of the resin layer is set to be 0.1 µm to 5 µm, in order to improve the adhesion between the resin layer and the copper foil, after a heat resistant layer and/or a rust-preventing layer and/or a chromate-treated layer and/or a silane coupling treated layer is provided on the surface-treated layer, it is preferable to form a resin layer on the heat resistant layer or the rust-preventing layer or the chromate-treated layer or the silane coupling treated layer.

When the resin layer includes a dielectric, the thickness of the resin layer is preferably 0.1 to 50 µm, preferably 0.5 µm to 25 µm, and more preferably 1.0 µm to 15 µm. The thickness of the resin layer means an average value of the thickness values measured at optional 10 points by cross-sectional observation.

On the other hand, when the thickness of the resin layer is made thicker than 120 µm, it is difficult to form a resin layer having the intended thickness by one step of application, and thus extraneous material cost and extraneous number of steps are needed to be economically disadvantageous. Moreover, the formed resin layer is poor in flexibility, cracks or the like tend to occur during handling the resin layer, and smooth lamination is sometimes made difficult due to the occurrence of excessive resin flow during the thermal compression bonding to the inner layer material.

Moreover, as another product form of the copper foil with resin and carrier, it is also possible to produce in a form of a copper foil with resin, without including the carrier, by coating a resin layer on the ultra-thin copper layer, or the heat resistant layer, or the rust-preventing layer, or the chromate-treated layer, or the silane coupling treated layer, by converting the resin layer into a semi-cured state, and by successively peeling the carrier.

Hereinafter, several examples of the production process of the printed wiring board using the resin substrate according to the present invention. A printed circuit board is completed by mounting electronic components on the printed wiring board.

An embodiment of the method for producing a printed wiring board according to the present invention, using a semi-additive method includes: a step of preparing a surface-treated copper foil and a resin substrate; a step of laminating the surface-treated copper foil, via the surface-treated layer side thereof, on the resin substrate; a step of obtaining the resin substrate of the present invention by removing the surface-treated copper foil on the resin substrate; and a step of forming a circuit on the surface of the resin substrate with the surface-treated copper foil removed therefrom.

Figure 2:
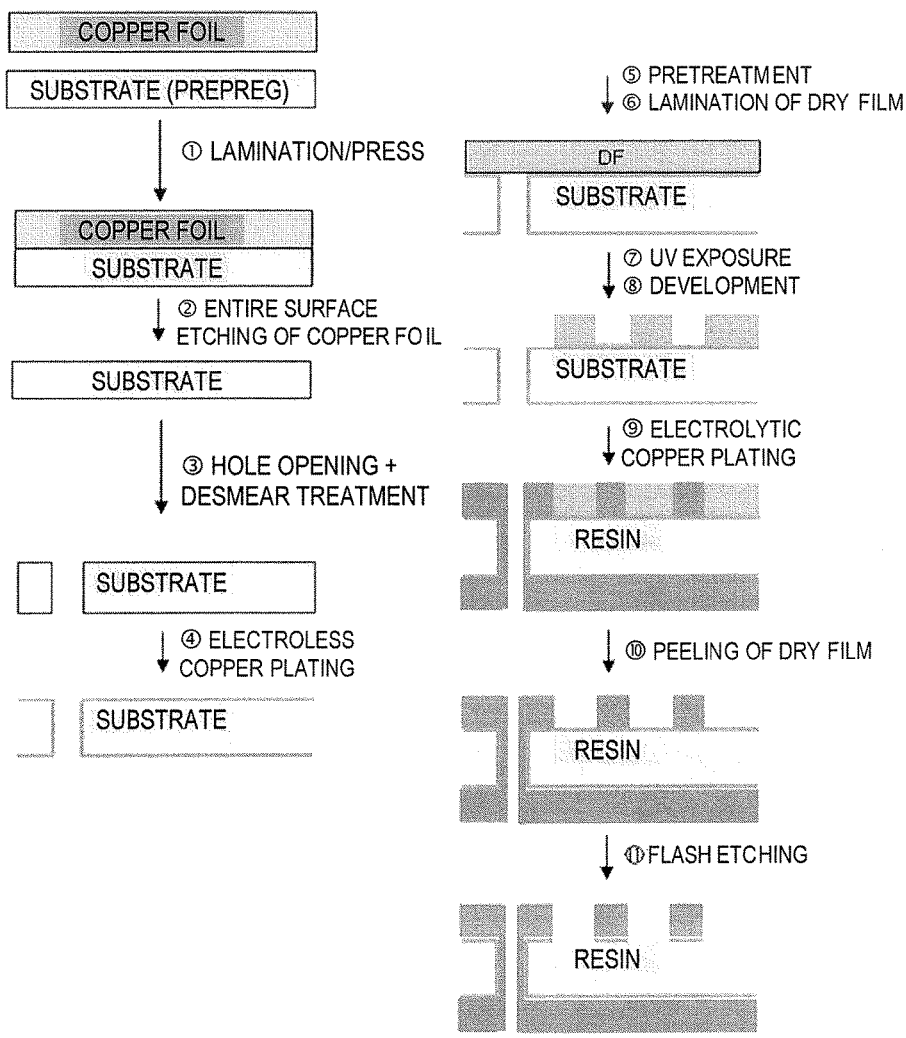
FIG. 2 illustrates a schematic example of a semi-additive method using the profile of a copper foil.

FIG. 2 illustrates a schematic example of a semi-additive method using the profile of a copper foil. In the method concerned, the surface profile of the copper foil is used for the formation of the surface profile of the resin substrate. Specifically, first, a copper clad laminate is prepared by laminating the copper foil of the present invention on the resin substrate. Next, the copper foil of the copper clad laminate is subjected to entire-surface etching. Next, electroless copper plating is applied to the surface of the resin substrate (entire-surface etched substrate) with the surface profile of the copper foil transferred thereon. Then, the portion, free from formation of circuit, of the resin substrate (entire-surface etched substrate) is coated with a dry film or the like, and electro (electrolytic) copper plating is applied to the surface, not coated with the dry film, of the electroless copper plating layer. Subsequently, after the dry film is removed, the electroless copper plating formed on the portion free from formation of circuit is removed to form a fine circuit. The fine circuit formed in the present invention adheres to the etched surface of the resin substrate (entire-surface etched substrate) with the surface profile of the copper foil of the present invention transferred thereon, and hence the adhesion (peel strength) of the fine circuit is made satisfactory.

The resin substrate can be a resin substrate incorporating an inner layer circuit. In the present invention, the semi-additive method means a method in which thin electroless plating is applied on a resin substrate or a copper foil seed layer, and after the formation of a pattern, a conductor pattern is formed by using electroplating or etching.

An embodiment of the method for producing a printed wiring board according to the present invention, using the semi-additive method includes: a step of preparing a copper foil with carrier and a resin substrate; a step of laminating the copper foil with carrier, via the ultra-thin copper layer side thereof, to the resin substrate; a step of peeling the carrier of the copper foil with carrier after the copper foil with carrier and the resin substrate are laminated on each other; a step of obtaining the resin substrate of the present invention by removing the ultra-thin copper layer on the resin substrate after peeling the carrier; and a step of forming a circuit on the surface of the resin substrate with the ultra-thin copper layer removed therefrom.

In the present invention, the semi-additive method means a method in which thin electroless plating is applied on an insulating substrate or a copper foil seed layer, subsequently electrolytic plating is performed if necessary, further subsequently, after formation of a pattern, a conductor pattern is formed by using electroplating and etching.

An embodiment of the method for producing a printed wiring board according to the present invention, using a semi-additive method includes: a step of preparing a copper foil with carrier and an insulating substrate; a step of laminating the copper foil with carrier, via the ultra-thin copper layer side thereof, on the insulating substrate; a step of peeling the carrier of the copper foil with carrier after laminating the copper foil with carrier and the insulating substrate on each other; a step of removing the ultra-thin copper layer on the insulating substrate after peeling the carrier; and a step of forming a circuit on the surface of the insulating substrate with the ultra-thin copper layer removed therefrom.

An embodiment of the method for producing a printed wiring board according to the present invention includes a step of laminating a surface-treated copper foil, via the surface-treated layer side thereof, on the resin substrate of the present invention to form a copper clad laminate, and then forming a circuit by a semi-additive method, a subtractive method, a partly additive method or a modified semi-additive method.

An embodiment of the method for producing a printed wiring board according to the present invention includes: a step of preparing the surface-treated copper foil and an insulating substrate; and a step of laminating the surface-treated copper foil. via the surface-treated layer side thereof, on the insulating substrate to form a copper clad laminate, and then forming a circuit by a semi-additive method, a subtractive method, a partly additive method or a modified semi-additive method.

In the present invention, the subtractive method means a method in which the unnecessary portion of the copper foil on the copper clad laminate is selectively removed by etching or the like to form a conductor pattern.

In the present invention, the partly additive method means a method in which catalyst nuclei are imparted on a substrate including a conductor layer, and including, if necessary, pierced holes for through-holes or via holes, and the substrate is etched to form a conductor circuit; and after a solder resist or a plating resist is provided if necessary, plating up is applied to the through-holes, via holes or the like on the conductor circuit by electroless plating treatment to produce a printed wiring board.

In the present invention, the modified semi-additive method means a method in which a metal foil is laminated on a resin substrate; the non-circuit-formation portion is protected with a plating resist, and the circuit-formation portion is subjected to copper plating up; and then, the resist is removed and the metal foil on the portion other than the circuit-formation portion is removed by (flash) etching to form a circuit on the resin substrate.

An embodiment of the method for producing a printed wiring board according to the present invention includes: a step of laminating a copper foil with carrier, via the ultra-thin copper layer side thereof, on the resin substrate of the present invention; and a step of laminating the copper foil with carrier and the resin substrate on each other, then forming a copper clad laminate by passing through a step of peeling the carrier of the copper foil with carrier, and then forming a circuit by a semi-additive method, a subtractive method, a partly additive method or a modified semi-additive method.

An embodiment of the method for producing a printed wiring board according to the present invention includes: a step of preparing the copper foil with carrier and the insulating substrate of the present invention; a step of laminating the copper foil with carrier, via the ultra-thin copper layer side thereof, on the insulating substrate; and a step of laminating the copper foil with carrier and the insulating substrate on each other, then forming a copper clad laminate by passing through a step of peeling the carrier of the copper foil with carrier, and then forming a circuit by a semi-additive method, a subtractive method, a partly additive method or a modified semi-additive method.

An embodiment of the method for producing a printed wiring board according to the present invention, using the semi-additive method, includes: a step of preparing a metal foil with a circuit formed; a step of forming a resin substrate on the surface of the metal foil so as for the circuit to be embedded; a step of laminating a surface-treated copper foil via the surface-treated layer side thereof on the resin substrate; a step of obtaining the resin substrate of the present invention by removing the surface-treated copper foil on the resin substrate; a step of forming a circuit on the surface of the resin substrate with the surface-treated copper foil removed therefrom; and a step of exposing the circuit formed on the surface of the metal foil and embedded in the resin substrate by removing the metal foil.

An embodiment of the method for producing printed wiring board according to the present invention using the semi-additive method, includes: a step of preparing a metal foil with a circuit formed on the surface thereof; a step of forming a resin layer on the surface of the metal foil so as for the circuit to be embedded; a step of laminating the surface-treated copper foil of the present invention, via the surface-treated layer side thereof, on the resin layer; a step of removing the surface-treated copper foil on the resin layer; a step of forming a circuit on the resin layer with the surface-treated copper foil removed therefrom; and a step of exposing the circuit formed on the surface of the metal foil and embedded in the resin layer by removing the metal foil.

An embodiment of the method for producing a printed wiring board according to the present invention, using the semi-additive method, includes: a step of forming a circuit on the surface on the ultra-thin copper layer side of a first copper foil with carrier; a step of forming a resin substrate on the surface on the ultra-thin copper layer side of the first copper foil with carrier so as for the circuit to be embedded; a step of preparing a second copper foil with carrier, and laminating the second copper foil with carrier via the ultra-thin copper layer side thereof on the resin substrate; a step of peeling the carrier of the second copper foil with carrier after laminating the second copper foil with carrier on the resin substrate; a step of obtaining the resin substrate of the present invention by removing the ultra-thin copper layer on the resin substrate after peeling the carrier of the second copper foil with carrier; a step of forming a circuit on the surface of the resin substrate with the ultra-thin copper layer removed therefrom; a step of peeling the carrier of the first copper foil with carrier after forming the circuit on the resin substrate; and a step of exposing the circuit formed on the surface on the ultra-thin copper layer side of the first copper foil with carrier and embedded in the resin substrate, by removing the ultra-thin copper layer of the first copper foil with carrier, after peeling the carrier of the first copper foil with carrier.

An embodiment of the method for producing a printed wiring board according to the present invention, using the semi-additive method, includes: a step of adopting the copper foil with carrier of the present invention as a first copper foil with carrier and forming a circuit on the surface on the ultra-thin copper layer side of the first copper foil with carrier; a step of forming a resin layer on the surface on the ultra-thin copper layer side of the first copper foil with carrier so as for the circuit to be embedded; a step of preparing a second copper foil with carrier, and laminating the second copper foil with carrier, via the ultra-thin copper layer side thereof of the second copper foil with carrier, on the resin layer; a step of peeling the carrier of the second copper foil with carrier; a step of removing the ultra-thin copper layer on the resin layer after the peeling of the carrier of the second copper foil with carrier; a step of forming a circuit on the surface of the resin layer with the ultra-thin copper layer removed therefrom; a step of peeling the carrier of the first copper foil with carrier after forming the circuit on the resin layer; and a step of exposing the circuit formed on the surface on the ultra-thin copper layer side of the first copper foil with carrier and embedded in the resin layer, by removing the ultra-thin copper layer of the first copper foil with carrier after peeling the carrier of the first copper foil with carrier.

An embodiment of the method for producing a printed wiring board according to the present invention includes: a step of preparing a metal foil with a circuit formed, a step of forming the resin substrate of the present invention on the surface of the metal foil so as for the circuit to be embedded, a step of laminating the surface-treated copper foil via the surface-treated layer side thereof on the resin substrate, and forming a circuit on the resin layer by a subtractive method, a partly additive method or a modified semi-additive method; and a step of exposing the circuit formed on the surface of the metal foil and embedded in the resin substrate by removing the metal foil.

An embodiment of the method for producing a printed wiring board according to the present invention includes: a step of preparing a metal foil with a circuit formed on the surface thereof; a step of forming a resin layer on the surface of the metal foil so as for the circuit to be embedded; a step of laminating the surface-treated copper foil of the present invention, via the surface-treated layer side thereof, on the resin layer, and forming a circuit on the resin layer by a subtractive method, a semi-additive method, a subtractive method, a partly additive method or a modified semi-additive method; and a step of exposing the circuit formed on the surface of the metal foil and embedded in the resin layer by removing the metal foil.

An embodiment of the method for producing a printed wiring board according to the present invention includes: a step of forming a circuit on the surface on the ultra-thin copper layer side of a first copper foil with carrier; a step of forming the resin substrate of the present invention on the surface on the surface on the ultra-thin copper layer side of the first copper foil with carrier so as for the circuit to be embedded; a step of preparing a second copper foil with carrier, laminating the second copper foil with carrier via the ultra-thin copper layer side thereof of the second copper foil with carrier on the resin substrate, peeling the carrier of the second copper foil with carrier, and forming a circuit on the resin substrate by a subtractive method, a partly additive method/process or a modified semi-additive method; a step of peeling the carrier of the first copper foil with carrier after forming the circuit on the resin substrate; and a step of exposing the circuit formed on the surface on the ultra-thin copper layer side of the first copper foil with carrier and embedded in the resin substrate by removing the ultra-thin copper layer of the first copper foil with carrier after peeling the carrier of the first copper foil with carrier.

An embodiment of the method for producing a printed wiring board according to the present invention includes: a step of adopting the copper foil with carrier of the present invention as a first copper foil with carrier and forming a circuit on the surface on the ultra-thin copper layer side of the first copper foil with carrier; a step of forming a resin layer on the surface on the ultra-thin copper layer side of the first copper foil with carrier so as for the circuit to be embedded; a step of preparing a second copper foil with carrier, laminating the second copper foil with carrier, via the ultra-thin copper layer side thereof of the second copper foil with carrier, on the resin layer, peeling the carrier of the second copper foil with carrier, and forming a circuit on the resin layer by a semi-additive method, a subtractive method, a partly additive method or a modified semi-additive method; and a step of exposing the circuit formed on the surface on the ultra-thin, copper layer side of the first copper foil with carrier and embedded in the resin layer by removing the ultra-thin copper layer of the first copper foil with carrier after peeling the carrier of the first copper foil with carrier.

An embodiment of the method for producing a printed wiring board according to the present invention, using the semi-additive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate on each other; a step of obtaining the resin substrate of the present invention by completely removing the ultra-thin copper layer exposed by peeling the carrier, by a method such as etching with a corrosive solution such as an acid or etching with plasma; a step of providing through-holes or/and blind vias in the resin exposed by removing the ultra-thin copper layer by etching; a step of performing desmear treatment in the region including the through-holes or/and blind vias; a step of providing an electroless plating layer in the region including the resin and the through-holes or/and the blind vias; a step of providing a plating resist on the electroless plating layer; a step of exposing the plating resist, and then removing the plating resist in the region where a circuit is to be formed; a step of providing an electrolytic layer in the region where the plating resist is removed and the circuit is to be formed; a step of removing the plating resist; and a step of removing the electroless plating layer in the region other than the region where the circuit is to be formed by flash etching or the like.

In an embodiment, the method for producing a printed wiring board of the present invention includes:

a step of preparing the surface-treated copper foil of the present invention with a circuit formed on the surface thereof on the surface-treated layer formed side, or the copper foil with carrier of the present invention, with a circuit formed on the surface thereof on the ultra-thin copper layer side;

a step of forming a resin layer on the surface of the surface-treated copper foil or the surface of the copper foil with carrier so as for the circuit to be embedded;

a step of forming a circuit on the surface of the resin layer; and a step of exposing the circuit embedded in the resin layer by removing the surface-treated copper foil or the copper foil with carrier.

In an embodiment, the method for producing a printed wiring board of the present invention includes:

a step of preparing a metal foil with a circuit formed on the surface thereof, or a first surface-treated copper foil being the surface-treated copper foil of the present invention with a circuit formed on the surface thereof on the surface-treated layer formed side, or a metal foil with carrier with a circuit formed on the surface thereof on the ultra-thin metal layer side, or a first copper foil with carrier being the copper foil with carrier of the present invention with a circuit formed on the surface thereof on the ultra-thin copper layer side;

a step of forming a resin layer on the surface of the metal foil, or the surface of the surface-treated copper foil, or the surface of the metal foil with carrier, or the surface of the copper foil with carrier so as for the circuit to be embedded;

a step of laminating the second surface-treated copper foil being the surface-treated copper foil of the present invention, via the surface-treated layer side thereof, on the resin layer, or a step of laminating the second copper foil with carrier being the copper foil with carrier of the present invention, via the ultra-thin copper layer side thereof, on the resin layer;

a step of peeling the carrier of the second copper foil with carrier, in the case where the foil laminated on the resin layer is the second copper foil with carrier;

a step of removing the surface-treated copper foil on the resin layer, or the ultra-thin copper layer remaining as a result of peeling the carrier of the second copper foil with carrier;

a step of forming a circuit on the surface of the resin layer with the surface-treated copper foil removed therefrom, or the surface of the resin layer with the ultra-thin copper layer removed therefrom; and a step of exposing the circuit embedded in the resin layer after forming the circuit on the resin layer by removing the metal foil, or by removing the first surface-treated copper foil, or by removing the ultra-thin metal layer after peeling the carrier of the metal foil with carrier, or by removing the ultra-thin copper layer after peeling the carrier of the first copper foil with carrier.

In the present invention, the metal foil with carrier includes at least a carrier and an ultra-thin metal layer in this order. As the carrier of the metal foil with carrier, a metal foil can be used. As the metal foil, there can be used copper foil, copper alloy foil, nickel foil, nickel alloy foil, aluminum foil, aluminum alloy foil, iron foil, iron alloy foil, stainless steel foil, zinc foil and zinc alloy foil. The thickness of the metal foil can be set to be 1 to 10000 µm, preferably 2 to 5000 µm, preferably 10 to 1000 µm, preferably 18 to 500 µm, and preferably 35 to 300 µm. As the carrier, a resin substrate, or an plate of an inorganic substance or an organic substance can also be used. The thickness of the resin substrate or the plate of an inorganic substance or an organic substance can be made the same as the above-described thickness of the metal foil.

The carrier and the metal foil may be laminated on each other through the intermediary of an adhesive or a release agent, or an intermediate layer, in a peelable manner. Alternatively, the carrier and the metal foil may be joined to each other by welding, deposition or the like in a peelable manner. When it is difficult to peel the carrier and the metal foil from each other, the joined portion between the carrier and the metal foil is removed by cutting or the like, and then the carrier and the metal foil may be peeled from each other.

The ultra-thin metal layer may be formed of copper, copper alloy, nickel, nickel alloy, aluminum, aluminum alloy, iron, iron alloy, stainless steel, zinc, or zinc alloy. The thickness of the ultra-thin metal layer is allowed to fall within the same range as the thickness range of the ultra-thin copper layer of the copper foil with carrier. The ultra-thin metal layer is preferably an ultra-thin copper layer from the viewpoint of the conductivity of the circuit formed therefrom.

In an embodiment, the method for producing a printed wiring board of the present invention includes:

a step of preparing the surface-treated copper foil of the present invention, with a circuit formed on the surface thereof on the surface-treated layer formed side, or the copper foil with carrier of the present invention, with a circuit formed on the surface thereof on the ultra-thin copper layer side;

a step of forming a resin layer on the surface of the surface-treated copper foil or the surface of the copper foil with carrier so as for the circuit to be embedded;

a step of laminating a metal foil on the resin layer, or a step of laminating a metal foil with carrier, via the ultra-thin metal layer side thereof, on the resin layer;

a step of peeling the metal foil with carrier, in the case where the foil laminated on the resin layer is the metal foil with carrier;

a step of removing the metal foil on the resin layer, or the ultra-thin metal layer remaining as a result of peeling the carrier of the metal foil with carrier;

a step of forming a circuit on the surface of the resin layer with the metal foil removed therefrom, or the surface of the resin layer with the ultra-thin copper layer removed therefrom; and a step of exposing the circuit embedded in the resin layer by removing the surface-treated copper foil after forming the circuit on the resin layer, or by removing the ultra-thin copper layer after peeling the carrier of the copper foil with carrier.

In an embodiment, the method for producing a printed wiring board of the present invention includes:

a step of preparing a metal foil with a circuit formed on the surface thereof, or a first surface-treated copper foil being the surface-treated copper foil of the present invention with a circuit formed on the surface thereof on the surface-treated layer formed side, or a metal foil with carrier with a circuit formed on the surface thereof on the ultra-thin metal layer side, or a first copper foil with carrier being the copper foil with carrier of the present invention with a circuit formed on the surface thereof on the ultra-thin copper layer side;

a step of forming a resin layer on the surface of the metal foil, or the surface of the surface-treated copper foil, or the surface of the metal foil with carrier, or the surface of the copper foil with carrier so as for the circuit to be embedded;

a step of laminating the second surface-treated copper foil being the surface-treated copper foil of the present invention, via the surface-treated layer side thereof, on the resin layer, or a step of laminating the second copper foil with carrier being the copper foil with carrier of the present invention, via the ultra-thin copper layer side thereof, on the resin layer;

a step of peeling the carrier of the second copper foil with carrier, in the case where the foil laminated on the resin layer is the second copper foil with carrier;

a step of forming a circuit on the resin layer, by using the surface-treated copper foil on the resin layer, or the ultra-thin copper layer remaining as a result of peeling the carrier of the second copper foil with carrier, by a semi-additive method, a subtractive method, a partly additive method or a modified semi-additive method; and a step of exposing the circuit embedded in the resin layer by removing the metal foil after forming a circuit on the resin layer, or by removing the first surface-treated copper foil, or by removing the ultra-thin metal layer after peeling the carrier of the metal foil with carrier, or by removing the ultra-thin copper layer after peeling the carrier of the first copper foil with carrier.

In an embodiment, the method for producing a printed wiring board of the present invention includes:

a step of preparing the surface-treated copper foil of the present invention with a circuit formed on the surface thereof on the surface-treated layer formed side, or the copper foil with carrier of the present invention with a circuit formed on the surface thereof on the ultra-thin copper layer side;

a step of forming a resin layer on the surface of the surface-treated copper foil or the surface of the copper foil with carrier so as for the circuit to be embedded;

a step of laminating a metal foil on the resin layer, of a step of laminating a metal foil with carrier, via the ultra-thin copper layer side thereof, on the resin layer;

a step of peeling the carrier of the metal foil with carrier, in the case where the foil laminated on the resin layer is the metal foil with carrier;

a step of forming a circuit on the resin layer, by using the metal foil on the resin layer, or the ultra-thin metal layer remaining as a result of peeling the carrier of the metal foil with carrier, by a semi-additive method, a subtractive method, a partly additive method or a modified semi-additive method; and a step of exposing the circuit embedded in the resin layer, by removing the surface-treated copper foil after forming a circuit on the resin layer, or by removing the ultra-thin copper layer after peeling the carrier of the copper foil with carrier.

In addition, an embodiment of the method for producing a printed wiring board according to the present invention includes:

a step of forming a circuit on the surface, on the ultra-thin copper layer side, of the copper foil with carrier of the present invention;

a step of forming a resin layer on the surface, on the ultra-thin copper layer side, of the copper foil with carrier so as for the circuit to be embedded;

a step of forming a circuit on the resin layer;

a step of peeling the carrier after the circuit is formed on the resin layer; and a step of exposing the circuit formed on the surface on the ultra-thin copper layer side and embedded in the resin layer by removing the ultra-thin copper layer after peeling the carrier.

In an embodiment of the method for producing a printed wiring board according to the present invention, using a semi-additive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate; a step of completely removing the ultra-thin copper layer exposed by peeling the carrier, by a method such as etching with a corrosive solution such as an acid or a method using plasma; a step of providing through-holes or/and blind vias in the resin exposed by removing the ultra-thin copper layer by etching; a step of performing desmear treatment in the region including the through-holes or/and blind vias; a step of providing an electroless plating layer in the region including the resin and the through-holes or/and the blind vias; a step of providing a plating resist on the electroless plating layer; a step of exposing the plating resist, and then removing the plating resist in the region where a circuit is to be formed; a step of providing an electrolytic plating layer in the region where the plating resist is removed and the circuit is to be formed; a step of removing the plating resist; and a step of removing the electroless plating layer in the region other than the region where the circuit is to be formed by flash etching or the like.

Another embodiment of the method for producing a printed wiring board according to the present invention, using a semi-additive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate on each other; a step of obtaining the resin substrate of the present invention by completely removing the ultra-thin copper layer exposed by peeling the carrier, by a method such as etching with a corrosive solution such as an acid or a method using plasma; a step of providing an electroless plating layer on the surface of the resin exposed by removing the ultra-thin copper layer by etching; a step of providing a plating resist on the electroless plating layer; a step of exposing the plating resist, and then removing the plating resist in the region where a circuit is to be formed; a step of providing an electrolytic plating layer in the region where the plating resist is removed and the circuit is to be formed; a step of removing the plating resist; and a step of removing, by flash etching or the like, the electroless plating layer and the ultra-thin copper layer in the region other than the region where the circuit is to be formed.

Another embodiment of the method for producing a printed wiring board according to the present invention, using a semi-additive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate on each other; a step of completely removing the ultra-thin copper layer exposed by peeling the carrier, by a method such as etching with a corrosive solution such as an acid or etching with plasma; a step of providing an electroless plating layer on the surface of the resin exposed by removing the ultra-thin copper layer by etching; a step of providing a plating resist on the electroless plating layer; a step of exposing the plating resist, and then removing the plating resist in the region where a circuit is to be formed; a step of providing an electrolytic plating layer in the region where the plating resist is removed and the circuit is to be formed; a step of removing the plating resist; and a step of removing the electroless plating layer and the ultra-thin copper layer in the region other than the region where the circuit is to be formed, by flash etching or the like.

An embodiment of the method for producing a printed wiring board according to the present invention, using a modified semi-additive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate on each other; a step of providing through-holes or/and blind vias in the ultra-thin copper layer exposed by peeling the carrier and the resin substrate; a step of obtaining the surface profile of the resin substrate of the present invention by performing desmear treatment in the region including the through-holes or/and blind vias; a step of providing an electroless plating layer in the region including the through-holes or/and blind vias; a step of providing a plating resist on the surface of the ultra-thin copper layer exposed by peeling the carrier; a step of forming a circuit by electrolytic plating after providing the plating resist; a step of removing the plating resist; and a step of removing, by flash etching, the ultra-thin copper layer exposed by removing the plating resist.

An embodiment of the method for producing a printed wiring board according to the present invention, using a modified semi-additive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate on each other; a step of providing through-holes or/and blind vias in the ultra-thin copper layer exposed by peeling the carrier and the insulating substrate; a step of performing a desmear treatment in the region including the through-holes or/and blind vias; a step of providing an electroless plating layer in the region including the through-holes or/and blind vias; a step of providing a plating resist on the surface of the ultra-thin copper layer exposed by peeling the carrier; a step of forming a circuit by electrolytic plating after providing the plating resist; a step of removing the plating resist; and a step of removing the ultra-thin copper layer exposed by removing the plating resist, by flash etching.

Another embodiment of the method for producing a printed wiring board according to the present invention, using a modified semi-additive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate on each other; a step of providing a plating resist on the ultra-thin copper layer exposed by peeling the carrier; a step of exposing the plating resist, and then removing the plating resist in the region where a circuit is to be formed; a step of providing an electrolytic plating layer in the region where the plating resist is removed and the circuit is to be formed; a step of removing the plating resist; and a step of obtaining the surface profile of the resin substrate of the present invention by removing, by flash etching or the like, the electroless plating layer and the ultra-thin copper layer in the region other than the region where the circuit is to be formed.

Another embodiment of the method for producing a printed wiring board according to the present invention, using a modified semi-additive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate on each other; a step of providing a plating resist on the ultra-thin copper layer exposed by peeling the carrier; a step of exposing the plating resist, and then removing the plating resist in the region where a circuit is to be formed; a step of providing an electrolytic plating layer in the region where the plating resist is removed and the circuit is to be formed; and a step of removing, by flash etching or the like, the electroless plating layer and the ultra-thin copper layer in the region other than the region where the circuit is to be formed.

An embodiment of the method for producing a printed wiring board according to the present invention, using a partly additive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate on each other; a step of providing through-holes or/and blind vias in the ultra-thin copper layer exposed by peeling the carrier and the resin substrate; a step of obtaining the surface profile of the resin substrate of the present invention by performing a desmear treatment in the region including the through-holes or/and blind vias; a step of imparting catalyst nuclei to the region including the through-holes or/and the blind vias; a step of providing an etching resist on the surface of the ultra-thin copper layer exposed by peeling the carrier; a step of forming a circuit pattern by exposing the etching resist; a step of forming a circuit by removing the ultra-thin copper layer and the catalyst nuclei by a method such as etching with a corrosive solution such as an acid or by etching with plasma; a step of removing the etching resist; a step of providing a solder resist or a plating resist on the surface of the resin substrate exposed by removing the ultra-thin copper layer and the catalyst nuclei by a method such as etching with a corrosive solution such as an acid or etching with plasma; and a step of providing an electroless plating layer in the region where neither a solder resist nor a plating resist is provided.

An embodiment of the method for producing a printed wiring board according to the present invention, using a partly additive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate on each other; a step of providing through-holes or/and blind vias in the ultra-thin copper layer exposed by peeling the carrier and the insulating substrate; a step of performing a desmear treatment in the region including the through-holes or/and the blind vias; a step of imparting catalyst nuclei to the region including the through-holes or/and the blind vias; a step of providing an etching resist on the surface of the ultra-thin copper layer exposed by peeling the carrier; a step of forming a circuit pattern by exposing the etching resist; a step of forming a circuit by removing the ultra-thin copper layer and the catalyst nuclei by a method such as etching with a corrosive solution such as an acid or by etching with plasma; a step of removing the etching resist; a step of providing a solder resist or a plating resist on the surface of the insulating substrate exposed by removing the ultra-thin copper layer and the catalyst nuclei by a method such as etching with a corrosive solution such as an acid or etching with plasma; and a step of providing an electroless plating layer in the region where neither a solder resist nor a plating resist is provided.

An embodiment of the method for producing a printed wiring board according to the present invention, using a subtractive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate; a step of providing through-holes or/and blind vias in the ultra-thin copper layer exposed by peeling the carrier and the resin substrate; a step of obtaining the surface profile of the resin substrate of the present invention by performing a desmear treatment in the region including the through-holes or/and the blind vias; a step of providing an electroless plating layer in the region including the through-holes or/and the blind vias; a step of providing an electrolytic plating layer on the surface of the electroless plating layer; a step of providing an etching resist on the surface of the electrolytic plating layer or/and the surface of the ultra-thin copper layer; a step of forming a circuit pattern by exposing the etching resist; a step of forming a circuit by removing the ultra-thin copper layer, and the electroless plating layer and the electrolytic plating layer, by a method such as etching with a corrosive solution such as an acid or etching with plasma; and a step of removing the etching resist.

An embodiment of the method for producing a printed wiring board according to the present invention, using a subtractive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate on each other; a step of providing through-holes or/and blind vias in the ultra-thin copper layer exposed by peeling the carrier and the insulating substrate; a step of performing a desmear treatment in the region including the through-holes or/and the blind vias; a step of providing an electroless plating layer in the region including the through-holes or/and the blind vias; a step of providing an electrolytic plating layer on the surface of the electroless plating layer; a step of providing an etching resist on the surface of the electrolytic plating layer or/and the surface of the ultra-thin copper layer; a step of forming a circuit pattern by exposing the etching resist; a step of forming a circuit by removing the ultra-thin copper layer, and the electroless plating layer and the electrolytic plating layer, by a method such as etching with a corrosive solution such as an acid or etching with plasma; and a step of removing the etching resist.

Another embodiment of the method for producing a printed wiring board according to the present invention, using a subtractive method, includes: a step of preparing a copper foil with carrier and a resin substrate; a step of laminating the copper foil with carrier and the resin substrate on each other; a step of peeling the carrier of the copper foil with carrier after laminating the copper foil with carrier and the resin substrate on each other; a step of providing through-holes or/and blind vias in the ultra-thin copper layer exposed by peeling the carrier and the resin substrate; a step of obtaining the surface profile of the resin substrate of the present invention by performing a desmear treatment in the region including the through-holes or/and the blind vias; a step of providing an electroless plating layer in the region including the through-holes or/and the blind vias; a step of forming a mask on the surface of the electroless plating layer; a step of providing an electrolytic plating layer on the surface of the electroless plating layer with no mask formed thereon; a step of providing an etching resist on the surface of the electrolytic plating layer or/and the surface of the ultra-thin copper layer; a step of forming a circuit pattern by exposing the etching resist; a step of forming a circuit by removing the ultra-thin copper layer and the electroless plating layer by a method such as etching with a corrosive solution such as an acid or etching with plasma; and a step of removing the etching resist.

Another embodiment of the method for producing a printed wiring board according to the present invention, using a subtractive method, includes: a step of preparing the copper foil with carrier and the insulating substrate according to the present invention; a step of laminating the copper foil with carrier and the insulating substrate on each other; a step of peeling the carrier of the copper foil with carrier after laminating the copper foil with carrier and the insulating substrate on each other; a step of providing through-holes or/and blind vias in the ultra-thin copper layer exposed by peeling the carrier and the insulating substrate; a step of performing a desmear treatment in the region including the through-holes or/and the blind vias; a step of providing an electroless plating layer in the region including the through-holes or/and the blind vias; a step of forming a mask on the surface of the electroless plating layer; a step of providing an electrolytic plating layer on the surface of the electroless plating layer with no mask formed thereon; a step of providing an etching resist on the surface of the electrolytic plating layer or/and the surface of the ultra-thin copper layer; a step of forming a circuit pattern by exposing the etching resist; a step of forming a circuit by removing the ultra-thin copper layer and the electroless plating layer by a method such as etching with a corrosive solution such as an acid or etching with plasma; and a step of removing the etching resist.

The step of providing through-holes or/and blind vias, and the subsequent desmear step may be omitted.

Here, a specific example of the method for producing a printed wiring board, using the copper foil with carrier of the present invention is described in detail.

Step 1: First, a copper foil with carrier (first layer) having an ultra-thin copper layer with a roughening-treated layer on the surface thereof is prepared.

Step 2: Next, a resist is applied on the roughening-treated layer of the ultra-thin copper layer, exposure and development are performed to etch the resist into a predetermined shape.

Step 3: Next, after forming a plating for a circuit, the resist is removed, and thus a circuit plating having a predetermined shape is formed.

Step 4: Next, a resin layer is laminated on the ultra-thin copper layer by providing embedding resin so as for the circuit plating to be covered (so as for the circuit plating to be embedded), and successively another copper foil with carrier (second layer) is made to adhere to the ultra-thin copper layer side.

Step 5: Next, from the copper foil with carrier as the second layer, the carrier is peeled. Alternatively, as the second layer, a copper foil having no carrier may also be used.

Step 6: Next, laser drilling is performed at the predetermined positions of the ultra-thin copper layer as the second layer, or the copper foil and the resin layer, and thus the circuit plating is exposed to form a blind via.

Step 7: Next, copper is implanted into the blind via to form a via fill.

Step 8: Next, on the via fill, a circuit plating is formed in the same manner as in above-described Steps 2 and 3.

Step 9: Next, from the copper foil with carrier as the first layer, the carrier is peeled.

Step 10: Next, by flash etching, the ultra-thin copper layers on both surfaces (in the case where as the second layer, a copper foil is provided, the copper foil is removed) are removed, to expose the surface of the circuit plating in the resin layer.

Step 11: Next, a bump is formed on the circuit plating in the resin layer, and a copper pillar is formed on the solder concerned. In this way, a printed wiring board using the copper foil with carrier of the present invention is prepared.

As the added copper foil with carrier (second layer), the copper foil with carrier of the present invention may be used, a conventional copper foil with carrier may also be used, and moreover, a common copper foil may also be used. In addition, on the circuit on the second layer in Step 8, a layer of a circuit or a plurality of layers of circuits may be formed, and the formation of these circuits may also be performed by a semi-additive method, a subtractive method, a partly additive method or a modified semi-additive method.

According to such a method for producing a printed wiring board as described above, because of the constitution allowing the circuit plating to be embedded in the resin layer, during removing the ultra-thin copper layer by flash etching as in, for example, the step 10, the circuit plating is protected by the resin layer, the shape of the circuit plating is maintained, and accordingly the formation of a fine circuit is facilitated. In addition, because the circuit plating is protected by the resin layer, the migration resistance is improved and the conduction of the circuit wiring is suppressed satisfactorily. Accordingly, the formation of a fine circuit is facilitated. As shown in the step 10 and the step 11, when the ultra-thin copper layer is removed by flash etching, the exposed surface of the circuit plating takes a shape recessed from the resin layer, and hence the formation of a bump on the circuit plating concerned, and moreover the formation of a copper pillar thereon are facilitated to improve the production efficiency.

As the embedding resin (resin, heretofore known resins and prepregs can be used. For example, there can be used BT (bismaleimide triazine) resin, a prepreg being a glass cloth impregnated with BT resin, and the ABF film and ABF manufactured by Ajinomoto Fine-Techno Co., Ltd. As the embedding resin (resin), the resin layer and/or the resin and/or the prepreg described in the present description can also be used.

The copper foil with carrier used as the first layer may have a substrate or a resin layer on the surface of the copper foil with carrier concerned. Because of having the substrate concerned or the resin layer concerned, the copper foil with carrier used as the first layer is supported and hardly undergoes wrinkles to offer an advantage that the productivity is improved. As the substrate or the resin layer, any substrate or any resin layer that has an effect to support the copper foil with carrier used as the first layer can be used. For example, as the substrate or the resin layer, the carriers, prepregs, and resin layers described in the description of the present application, and heretofore known carriers, prepregs, resin layers, metal plates, metal foils, plates of inorganic compounds, foils of inorganic compounds, plates of organic compounds and foils of organic compounds can be used.

In addition, by mounting electronic components and the like on the printed wiring board, a printed circuit board is completed. In the present invention, the "printed wiring board" is defined to include such a printed wiring board with electronic components mounted thereon, a printed circuit board, and a printed substrate.

Additionally, electronic devices may also be fabricated by using the printed wiring board concerned, electronic devices may also be fabricated by using the printed wiring board concerned with electronic components mounted thereon, or electronic devices may also be fabricated by using the printed substrate concerned with electronic components mounted thereon.

EXAMPLES

Hereinafter, Examples of the present invention are described; these Examples are presented for the purpose of better understanding of the present invention and the advantages thereof, and are not intended to limit the present invention.

In present Example, as described below, the surface profile of the resin substrate formed by using a copper foil and the surface profile of the resin substrate formed by using a chemical solution were produced.

1. Formation of Surface Profile of Resin Substrate Using Copper Foil

Figure 3:
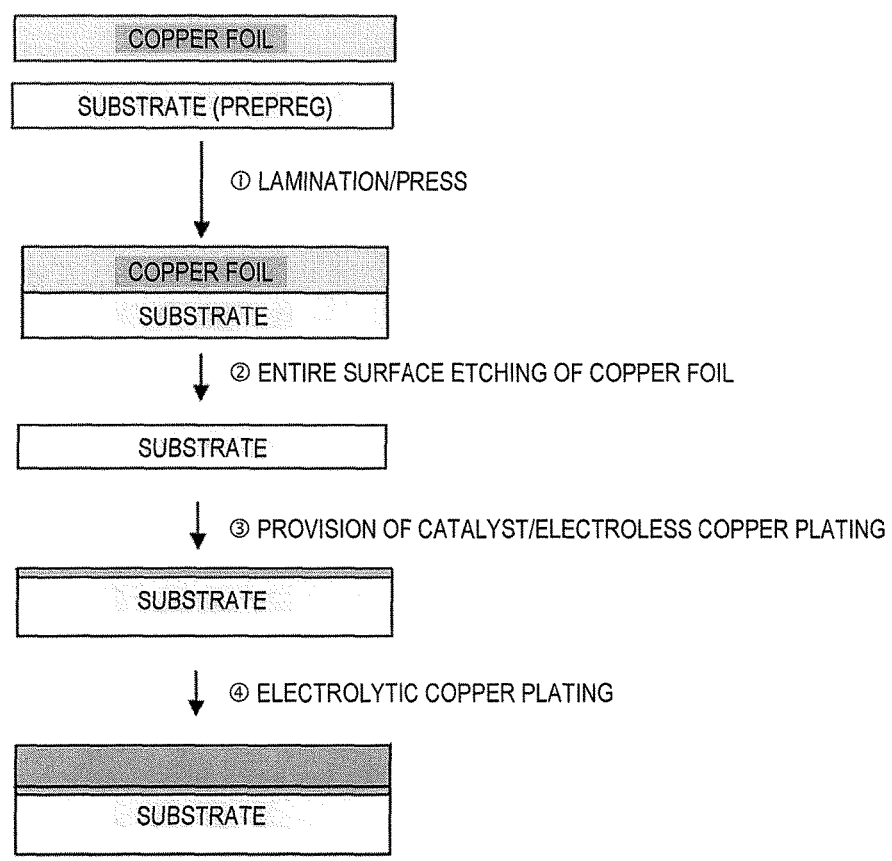
FIG. 3 illustrates a production flow of samples for obtaining the data of Examples and Comparative Examples.

FIG. 3 illustrates a production flow of samples for obtaining the data of Examples and Comparative Examples.

Examples 1 to 3, and 6, and Comparative Examples 1 to 3

In each of Examples 1 to 3 and 6, and Comparative Examples 1 to 3, as a carrier, a 35-μm-thick lengthy electrolytic copper foil (JTC manufactured by JX Nippon Mining & Metals Corp.) was prepared. On the glossy surface (shiny surface) of the copper foil, a Ni layer having a deposition amount of 4000 μg/dm$^2$ was formed by performing electroplating with a roll-to-roll type continuous plating line under the following conditions.

(Ni Layer)
Nickel sulfate: 200 to 300 g/L
Trisodium citrate: 2 to 10 g/L
pH: 2 to 4
Bath temperature: 40 to 70° C.
Current density: 1 to 15 A/dm$^2$ Next, after the surface of the Ni layer formed above was washed with water and washed with an acid, successively on the roll-to-roll type continuous plating line, on the Ni layer, a Cr layer having a deposition amount of 11 μg/dm$^2$ was attached by performing an electrolytic chromate treatment under the following conditions.

(Electrolytic Chromate Treatment)
Solution composition: Potassium bichromate: 1 to 10 g/L, zinc: 0 to 5 g/L
pH: 3 to 4
Solution temperature: 50 to 60° C.

Current density: 0.1 to 2.6 A/dm$^2$
Coulomb quantity: 0.5 to 30 As/dm$^2$

Successively on the roll-to-roll type continuous plating line, on the Cr layer, an ultra-thin copper layer having a thicknesses described in the table was formed by performing electroplating under the following conditions, and thus an ultra-thin copper foil with carrier was produced.

Ultra-Thin Copper Layer
Copper concentration: 30 to 120 g/L
H$_2$SO$_4$ concentration: 20 to 120 g/L
Electrolyte temperature: 20 to 80° C.
Glue: 1 to 20 ppm
Current density: 10 to 100 A/dm$^2$

Example 4

A copper sulfate electrolyte having a copper concentration of 80 to 120 g/L, a sulfuric acid concentration of 80 to 120 g/L, a chloride ion concentration of 30 to 100 ppm and a glue concentration of 1 to 5 ppm, and a electrolyte temperature of 57 to 62° C. was used as an electrolytic copper plating bath, a linear speed of the electrolyte flowing between the anode and the cathode (a metal drum for electrodeposition for copper foil) was set at 1.5 to 2.5 m/sec, and a current density was set at 70 A/dm$^2$, and thus, a double flat sided electrolytic raw foil having a thickness of 12 μm (thickness in terms of weight per unit area: 95 g/m$^2$) was produced.

Example 5

As a raw foil, a 12-μm-thick rolled copper foil manufactured by JX Nippon Mining & Metals Corp. was prepared.

On the surface of the raw foil of each of foregoing Examples and Comparative Examples, a primary particle layer (Cu) and a secondary particle layer (a copper-cobalt-nickel alloy plating or the like) was formed within the condition ranges shown below.

The bath compositions used and the plating conditions used are as shown in Tables 1 to 3. In Table 1, the cases in each of which two sets of current conditions and coulomb quantities are described in the column under the heading of the primary particle current conditions mean the cases in each of which the first plating was performed under the first condition, and then the second plating was further performed under the second condition. For example, in the column under the heading of Primary particle current conditions of Example 1, there is a description of "(65 A/dm$^2$, 70 As/dm$^2$)+(20 A/dm$^2$, 40 As/dm$^2$)"; this means that a plating was performed with the current density of 65 A/dm$^2$ and the coulomb quantity of 70 As/dm$^2$ for forming the primary particles, and then further a plating was performed with the current density of 20 A/dm$^2$ and the coulomb quantity of 40 As/dm$^2$ for forming the primary particles. In Table 1, the values for Example 6 and Comparative Example 3, described in the column under the heading of "Linear speed of plating solution during formation of primary particles (m/s)" each mean the linear speed of the plating solution during the formation of the secondary particles. Because in Example 6 and Comparative Example 3, primary particles were not formed, "Plating for forming secondary particles" in Table 1 of each of Example 6 and Comparative Example 3 corresponds to the plating for forming primary particles. It is to be noted that the linear speed of the plating solution during the formation of the secondary particles in each of Examples and Comparative Examples other than Example 6 and Comparative Example 3 was set at 2.5 m/sec.

[Barrier (Heat Resistance) Treatment]

A barrier (heat resistance) treatment was performed under the following conditions, to form a brass plating layer or a zinc-nickel alloy plating layer.

Formation Conditions of Barrier Layers (Brass Plating) of Example 1 and Comparative Example 1:

By using a brass plating bath having a copper concentration of 50 to 80 g/L, a zinc concentration of 2 to 10 g/L, a sodium hydroxide concentration of 50 to 80 g/L, a sodium cyanate concentration of 5 to 30 g/L, and being set at a temperature of 60 to 90° C., a plating electric quantity of 30 As/dm$^2$ was imparted to the M surface having a roughening-treated layer formed thereon, at a current density of 5 to 10 A/dm$^2$ (multistage treatment).

Formation Conditions of Barrier Layers (Zinc-Nickel Plating) of Example 2 and Comparative Example 2:

By using a plating bath containing, as added therein, Ni: 10 g/L to 30 g/L, Zn: 1 g/L to 15 g/L, sulfuric acid (H$_2$SO$_4$): 1 g/L to 12 g/L, and chloride ion: 0 g/L to 5 g/L, a plating electric quantity of 5.5 As/dm$^2$ was imparted to the M surface having a roughening-treated layer formed thereon, at a current density of 1.3 A/dm$^2$.

[Rust-Preventing Treatment]

In each of Example 1 and Comparative Example 1, a rust-preventing treatment (chromate treatment) was performed under the following conditions to form a rust-preventing layer.

(Chromate conditions) In a chromate bath containing CrO$_3$: 2.5 g/L, Zn: 0.7 g/L, and Na$_2$SO$_4$: 10 g/L, having a pH 4.8, and being set at 54° C., an electric quantity of 0.7 As/dm$^2$ was added. Moreover, immediately after the completion of the rust-preventing treatment in the chromate bath, by using a liquid shower pipe, the whole roughening-treated surface was subjected to a showering by using the same chromate bath.

[Application of Silane Coupling Agent]

A silane coupling agent application treatment was performed by spraying a solution containing 0.2 to 2% of an alkoxysilane and having a pH of 7 to 8 to the roughening-treated surface of a copper foil.

Moreover, in Example 6, after the rust-preventing treatment and the application of a silane coupling agent, a resin layer was formed under the following conditions.

(Example of Resin Synthesis)

In a 2-liter three-necked flask equipped with a stainless steel anchor-type stirring rod, a nitrogen introduction tube and a reflux condenser equipped with a bulb condenser equipped on the top of a trap with stopcock, 117.68 g (400 mmol) of 3,4, 3',4'-biphenyltetracarboxylic acid dihydrate, 87.7 g (300 mmol) of 1,3-bis(3-aminophenoxy)benzene, 4.0 g (40 mmol) of γ-valerolactone, 4.8 g (60 mmol) of pyridine, 300 g of N-methyl-2-pyrrolidone (hereinafter denoted as NMP), and 20 g of toluene were added, the resulting mixture was heated at 180° C. for 1 hour and then cooled to around room temperature, subsequently 29.42 g (100 mmol) of 3,4,3',4'-biphenyltetracarboxylic acid dihydrate, 82.12 g (200 mmol) of 2,2-bis[4-(4-aminophenoxy)phenyl]propane, 200 g of NMP and 40 g of toluene were added to the mixture, the resulting mixture was mixed at room temperature for 1 hour and then heated at 180° C. for 3 hours, and thus a block copolymerized polyimide having a solid content of 38%. This block copolymerized polyimide had a ratio between the following general formulas (1) and (2), the general formula (1): the general formula (2)=3:2, a number average molecular weight of 70000, and a weight average molecular weight of 150000.

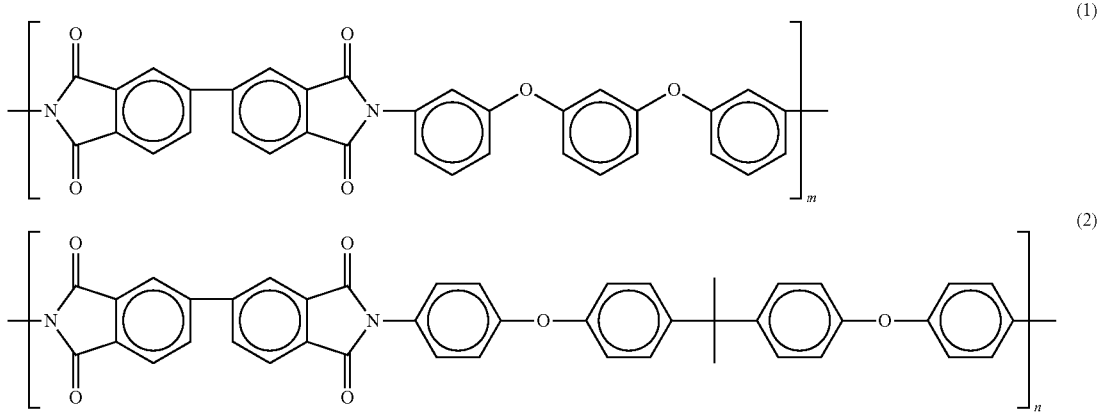

The block copolymerized polyimide solution obtained in the synthesis example was further diluted with NMP into a block copolymerized polyimide solution having a solid content of 10%. To this block copolymerized polyimide solution, bis(4-maleimidephenyl)methane (BMI-H, K•I Chemical Industry Co., Ltd.) was added so as to have a solid content proportion of 35 in relation to a solid content proportion of the block copolymerized polyimide of 65 (specifically, the solid content weight of the bis(4-maleimidephenyl)methane contained in the resin solution: the solid content weight of the block copolymerized polyimide=35:65), and the resulting solution was dissolved and mixed at 60° C. for 20 minutes to yield a resin solution. Subsequently, the resin solution was applied, by using a reverse roll coating machine, in Example 28 to the M surface (high gloss surface) of the copper foil, and in Example 8 to the ultra-thin copper, dried in an nitrogen atmosphere, at 120° C. for 3 minutes and at 160° C. for 3 minutes, and then finally heat treated at 300° C. for 2 minutes, and thus, a copper foil provided with a resin layer was prepared in each of Example 28 and Example 8. The thickness of the resin layer was set to be 2 μm.

In each of following Examples, the formation of the intermediate layer was performed under the following conditions.

Example 7

A copper layer was formed under the same conditions as in Example 1, except that a Co—Mo alloy layer was formed as an intermediate layer between the carrier and the copper foil. In this case, the Co—Mo alloy intermediate layer was prepared by performing a plating in a plating solution having the following solution composition.

Solution composition: $CoSO_4 \cdot 7H_2O$: 0.5 to 100 g/L, $Na_2MoO_4 \cdot 2H_2O$: 0.5 to 100 g/L, sodium citrate dihydrate: 20 to 300 g/L
Temperature: 10 to 70° C.
pH: 3 to 5
Current density: 0.1 to 60 A/dm$^2$

Example 8

A copper layer was formed under the same conditions as in Example 1, except that a Cr layer was formed as an intermediate layer between the carrier and the copper foil. In this case, the Cr intermediate layer was prepared by performing a plating in a plating solution having the following solution composition.

Solution composition: $CrO_3$: 200 to 400 g/L, $H_2SO_4$: 1.5 to 4 g/L
pH: 1 to 4
Solution temperature: 45 to 60° C.
Current density: 10 to 40 A/dm$^2$

Example 9

A copper layer was formed under the same conditions as in Example 1, except that a Cr/CuP layer was formed as an intermediate layer between the carrier and the copper foil. In this case, the Cr/CuP intermediate layer was prepared by performing a plating in a plating solution having the following solution composition.

Solution composition 1: $CrO_3$: 200 to 400 g/L, $H_2SO_4$: 1.5 to 4 g/L
pH: 1 to 4
Solution temperature: 45 to 60° C.
Current density: 10 to 40 A/dm$^2$
Solution composition 2: $Cu_2P_2O_7 \cdot 3H_2O$: 5 to 50 g/L, $K_4P_2O_7$: 50 to 300 g/L
Solution temperature: 30 to 60° C.
pH: 8 to 10
Current density: 0.1 to 1.0 A/dm$^2$

Example 10

A copper layer was formed under the same conditions as in Example 1, except that a Ni/Cr layer was formed as an intermediate layer between the carrier and the copper foil. In this case, the Ni/Cr intermediate layer was prepared by performing a plating in a plating solution having the following solution composition.

Solution composition 1: $NiSO_4 \cdot 6H_2O$: 250 to 300 g/L, $NiCl_2 \cdot 6H_2O$: 35 to 45 g/L, boric acid: 10 to 50 g/L
Solution temperature: 30 to 70° C.
pH: 2 to 6
Current density: 0.1 to 50 A/dm$^2$
Solution composition 2: $CrO_3$: 200 to 400 g/L, $H_2SO_4$: 1.5 to 4 g/L
Solution temperature: 45 to 60° C.
pH: 1 to 4
Current density: 10 to 40 A/dm$^2$

Example 11

A copper layer was formed under the same conditions as in Example 1, except that a Co/chromate-treated layer was formed as an intermediate layer between the carrier and the copper foil.

In this case, the Co/chromate-treated intermediate layer was prepared by performing a plating in a plating solution having the following solution composition.

Solution composition 1: $CoSO_4.7H_2O$: 10 to 100 g/L, sodium citrate dihydrate: 30 to 200 g/L
Solution temperature: 10 to 70° C.
pH: 3 to 5
Current density: 0.1 to 60 $A/dm^2$
Solution composition 2: $CrO_3$: 1 to 10 g/L
Solution temperature: 10 to 70° C.
pH: 10 to 12
Current density: 0.1 to 1.0 $A/dm^2$

Example 12

A copper layer was formed under the same conditions as in Example 1, except that an organic substance layer was formed as an intermediate layer between the carrier and the copper foil.

In this case, the organic substance intermediate layer was prepared under the conditions that an aqueous solution of carboxybenzotriazole having a solution temperature of 40° C., a pH of 5, a concentration 1 of 10 g/L was sprayed for 10 to 60 seconds.

—Evaluation of Surface-Treated Copper Foil and Copper Foil with Carrier—

The surface-treated copper foils and the copper foils with carrier obtained as described above were subjected to various evaluations on the basis of the following methods. The results thus obtained are shown in Table 4.

<Proportion of Area Corresponding to Particles>

For each of the surface-treated copper foils and the copper foils with carrier of Examples and Comparative Examples, the average diameter of the roughened particles and the number density of the particles were measured as follows. Then, the proportion of the area corresponding to the particles was calculated on the basis of the following formula.

proportion (–) of area corresponding to particles=number density of particles (particles/$\mu m^2$)×equivalent circle area per one particle having average diameter equivalent circle area per one particle having average diameter ($\mu m^2$/particle)=(average diameter of the particles ($\mu m$)/2)$^2$×π(1/particle)

The proportion of the area corresponding to the particles in an index indicating the degree of the area of the surface-treated copper foil covered by the roughened particles.

<Average Diameter of Particles>

For each of the surface-treated copper foils and the copper foils with carrier of Examples and Comparative Examples, photography (magnification: 30000) was performed in three fields of view on the surface-treated surface by using a scanning electron microscope. In the three fields of view (the size of one field of view: 4.14 μm in width×3.07 μm in length=area of 12.71 $\mu m^2$), the particle diameter of each of the roughened particles was measured. Here, the particle diameter of a particle was taken as the diameter of the smallest circle surrounding the particle. The arithmetic average value of the particle diameter values obtained in the three views of field was taken as the average diameter of the particles. Even in the case where the particles were brought into contact with each other, when the boundaries of the particles were able to be identified, the particle diameters of the particles concerned, brought into with each other contact, were separately counted.

<Number Density of Particles>

For each of the surface-treated copper foils and the copper foils with carrier of Examples and Comparative Examples, photography (magnification: 30000) was performed in three fields of view on the surface-treated surface by using a scanning electron microscope. In the three fields of view (the size of one field of view: 4.14 μm in width×3.07 μm in length=area of 12.71 $\mu m^2$), the number of the roughened particles was measured. From the number of the roughened particles obtained in the three views of field, the number of the roughened particles per unit area ($\mu m^2$) was calculated, and the thus calculated value was taken as the number density of the particles. Even in the case where the particles were brought into contact with each other, when the boundaries of the particles were able to be identified, the particles concerned, brought into with each other contact, were separately counted.

—Evaluation of Substrate Surface—

Next, for each of the surface-treated copper foils and the copper foils with carrier of Examples and Comparative Examples, a 20-cm square size of the following resin substrate was prepared, and the resin substrate were laminated and pressed to each other in such a way that the surface of the copper foil, having the surface-treated layer was brought into contact with the resin substrate. The recommended conditions of the substrate maker were adopted for the temperature, the pressure and the time in the lamination press.

Resin used: FR4

Next, the surface-treated copper foil on the resin substrate was removed by entire-surface etching under the following etching conditions. For the copper foil with carrier on the resin substrate, after peeling the carrier, the ultra-thin copper layer was removed by entire-surface etching under the following etching conditions. The "entire-surface etching" as referred to herein means an etching performed until the full thickness of the copper foil is removed, and the resin is exposed all over the surface.

(Etching conditions) Etching solutions: cupric chloride solution, HCl concentration: 3.5 mol/L, temperature: 50° C., $CuCl_2$ concentration: regulated so as to give a specific gravity of 1.26

Example 13

In Comparative Example 13, two 100-μm-thick sheets of FR4 were prepared. The two sheets of the substrate were superposed on each other, and a release layer film was bonded to each side of the set of the two sheets, and the set of the two sheets was subjected to lamination pressing. The recommended conditions of the substrate maker were adopted for the temperature, the pressure and the time in the lamination press. After completion of lamination pressing, the release layer films were removed from the resin substrates, and on the surfaces of the resin substrate, shower treatments A and B and a neutralization treatment were performed under the following treatment conditions, to form the surface profile of the resin substrate.

(Shower Treatment Conditions A)
Desmear treatment solution: 40 g/L KMnO4, 20 g/L NaOH
Treatment temperature: Room temperature Treatment time: 15 minutes
Shower pressure: 0.4 MPa
(Shower Conditions B)
Desmear treatment solution: 90 g/L KMnO4, 5 g/L HCl
Treatment temperature: 49° C.
Treatment time: 20 minutes
Shower pressure: 0.4 MPa
(Neutralization Conditions)
Neutralization treatment solution: L-Ascorbic acid 80 g/L
Treatment temperature: Room temperature
Immersion time: 3 minutes
No stirring Thus, the formation of the surface profiles of the resin substrates using chemical solutions was performed.

<Average Length of White Portions and Average Length of Black Portions>

For each of the etched side surfaces of the resin substrates of Examples and Comparative Examples, by using a scanning electron microscope (SEM), photography was performed with an acceleration voltage set at 15 kV. During photography, contrast and brightness were regulated so as for the contours of the holes in the whole observation field to be clearly seen. Photography was performed in the state in which the contours of the holes were able to be observed, but not in the state in which the entire photograph was white or black. A black-white image processing was applied to the taken photographs (SEM images (magnification of 30 k (30000)), by using Photo Shop 7.0 software. Next, as shown in FIG. 1, four lines (the lines A to D) were drawn to divide the obtained image into nine equal areas; the sum of the lengths of the line segments passing through the white portions (the white region) was measured for each of the lines A to D, and the total of the sums for the lines A to D was calculated to determine the length of the white portions. This measurement was performed for three fields of view of the surface of the resin substrate as the measurement object, and the average value of the values of the three fields of view (the size of one field of view: 4.14 μm in width×3.07 μm in length=area of 12.71 μm$^2$) was taken as the average length (μm) of the white portions. In addition, the sum of the lengths of the line segments passing through the black portions (the black region) was measured for each of the lines A to D, and the total of the sums for the lines A to D was calculated to determine the length of the black portions. This measurement was performed for three fields of view of the surface of the resin substrate as the measurement object, and the average value of the values of the three fields of view was taken as the average length (μm) of the black portions.

<Maximum Length of White Portions, and Maximum Length of Black Portions>

For the surface on the etching side of each of the resin substrates of Examples and Comparative Examples, in the image obtained from the above described SEM image, from comprehensive consideration of all the four lines (the lines A to D), the maximum length of the measured white portions (the maximum of the distances between the black portions adjacent to the respective white portions) and the maximum length of the measured black portions (the maximum of the distances between the white portions adjacent to the respective black portions) were determined.

<Average Length of Largest 10 White Portions, and Average Length of Largest 10 Black Portions>

For the surface on the etching side of each of the resin substrates of Examples and Comparative Examples, in the image obtained from the above described SEM image, the average length of the largest 10 white portions, and the average length of the largest 10 black portions were determined.

<Proportion of White Portions>

For the surface on the etching side of each of the resin substrates of Examples and Comparative Examples, in the image obtained from the above described SEM image, the proportion of the white portions in relation to the total of the white portions and the black portions.

<Peel Strength>

The etched surface of each of the resin substrates (entire-surface etched substrates) was provided with a catalyst for depositing electroless copper, and was subjected to an electroless copper plating under the following conditions by using the KAP-8 bath manufactured by Kanto Kasei Co., Ltd. The thickness of the obtained electroless copper plating was 0.5 μm.

$CuSO_4$ concentration: 0.06 mol/L, HCHO concentration: 0.5 mol/L, EDTA concentration: 0.12 mol/L, pH12.5, additive: 2,2'-bipyridyl, additive concentration: 10 mg/L, surfactant: REG-1000, surfactant concentration: 500 mg/L Next, on the electroless copper plating, further electrolytic plating was performed by using the following electrolyte. The copper thickness (total thickness of electroless plating and electrolytic plating) was 12

Simple copper sulfate electrolyte: Cu concentration: 100 g/L, $H_2SO_4$ concentration: 80 g/L A 10-mm-wide copper circuit was formed by wet etching on the laminate with copper plating formed as described above by subjecting the resin substrate (entire-surface etched substrate) to electroless copper plating and electrolytic copper plating so as to have a copper layer thickness of 12 μm. According to JIS-C-6481, the strength in the case of peeling this copper circuit at an angle of 90 degrees was measured to be taken as the peel strength.

<Fine Wiring Formability>

On the laminate with copper plating formed as described above by subjecting the resin substrate (entire-surface etched substrate) to electroless copper plating and electrolytic copper plating so as to have a copper layer thickness of 12 μm, circuits having L(line)/S(space)=15 μm/15 μm and 10 μm/10 μm, respectively, were formed by processing the plating copper by etching. In this case, the fine wirings formed on the resin substrate was visually observed, and the case where the detachment of the circuit, the shortening between the circuits (abnormal deposition of copper between circuits) and the deficit of the circuit were not found was marked as acceptable (circle).

TABLE 1

| | Raw foil | Intermediate layer | Ultra-thin copper layer thickness (μm) | Plating bath for forming primary particles (Table 2) | Primary particle current conditions | Linear speed of plating solution during formation of primary particles (m/s) | Plating bath for forming secondary particles (Table 3) | Secondary particle current conditions |
|---|---|---|---|---|---|---|---|---|
| Example 1 | Cooper foil with carrier | Ni/chromate | 1 | (1) | (68 A/dm2, 70 As/dm2) + (20 A/dm2, 40 As/dm2) | 2.5 | (1) | (25 A/dm2, 20 As/dm2) |
| Example 2 | Cooper foil with carrier | Ni/chromate | 5 | (1) | (68 A/dm2, 70 As/dm2) + (20 A/dm2, 30 As/dm2) | 2.5 | (1) | (28 A/dm2, 15 As/dm2) |
| Example 3 | Cooper foil with carrier | Ni/chromate | 2 | (1) | (70 A/dm2, 65 As/dm2) + (20 A/dm2, 30 As/dm2) | 2.5 | (1) | (28 A/dm2, 15 As/dm2) |
| Example 4 | Double flat sided electrolytic raw foil | | | (1) | (68 A/dm2, 70 As/dm2) + (20 A/dm2, 40 As/dm2) | 2.5 | (1) | (25 A/dm2, 20 As/dm2) |
| Example 5 | Rolled copper foil | | | (1) | (68 A/dm2, 70 As/dm2) + (20 A/dm2, 40 As/dm2) | 2.5 | (1) | (25 A/dm2, 20 As/dm2) |
| Example 6 | Cooper foil with carrier | Ni/chromate | 2 | — | — | 3.5 | (1) | (48 A/dm2, 10 As/dm2) |
| Example 7 | Cooper foil with carrier | Co—Mo alloy | 2 | (2) | (68 A/dm2, 70 As/dm2) + (20 A/dm2, 40 As/dm2) | 2.5 | (2) | (25 A/dm2, 20 As/dm2) |
| Example 8 | Cooper foil with carrier | Cr | 2 | (3) | (68 A/dm2, 70 As/dm2) + (20 A/dm2, 40 As/dm2) | 2.5 | (3) | (25 A/dm2, 20 As/dm2) |
| Example 9 | Cooper foil with carrier | Cr/CuP | 2 | (4) | (68 A/dm2, 70 As/dm2) + (20 A/dm2, 40 As/dm2) | 2.5 | (4) | (25 A/dm2, 20 As/dm2) |
| Example 10 | Cooper foil with carrier | Ni/Cr | 2 | (1) | (68 A/dm2, 70 As/dm2) + (20 A/dm2, 40 As/dm2) | 2.5 | (5) | (25 A/dm2, 20 As/dm2) |
| Example 11 | Cooper foil with carrier | Co/chromate | 2 | (1) | (68 A/dm2, 70 As/dm2) + (20 A/dm2, 40 As/dm2) | 2.5 | (1) | (25 A/dm2, 20 As/dm2) |
| Example 12 | Cooper foil with carrier | Organic substance | 2 | (1) | (68 A/dm2, 70 As/dm2) + (20 A/dm2, 40 As/dm2) | 2.5 | (1) | (25 A/dm2, 20 As/dm2) |
| Comparative Example 1 | Cooper foil with carrier | Ni/chromate | 2 | (1) | (68 A/dm2, 130 As/dm2) + (20 A/dm2, 50 As/dm2) | 2.5 | (1) | (25 A/dm2, 20 As/dm2) |
| Comparative Example 2 | Cooper foil with carrier | Ni/chromate | 2 | (1) | (68 A/dm2, 70 As/dm2) + (20 A/dm2, 60 As/dm2) | 1.0 | (1) | (25 A/dm2, 20 As/dm2) |
| Comparative Example 3 | Cooper foil with carrier | Ni/chromate | 2 | — | — | 3.5 | (1) | (62 A/dm2, 8 As/dm2) |

TABLE 2

| Plating bath (1) | Plating bath (2) | Plating bath (3) | Plating bath (4) |
|---|---|---|---|
| Cu: 15 g/L | Cu: 15 g/L | Cu: 15 g/L | Cu: 15 g/L |
| $H_2SO_4$: 75 g/L | $H_2SO_4$: 100 g/L | $H_2SO_4$: 100 g/L | $H_2SO_4$: 100 g/L |
| Solution temperature: 25 to 35° C. | W: 3 mg/L Sodium dodecyl sulfate: 10 mg/L Temperature: 50° C. | As: 1000 mg/L Sodium dodecyl sulfate: 10 mg/L Temperature: 50° C. | W: 3 mg/L As: 1000 mg/L Sodium dodecyl sulfate: 10 mg/L Temperature: 50° C. |

The plating baths are all aqueous solutions.

TABLE 3

| Plating bath (1) | Plating bath (2) | Plating bath (3) | Plating bath (4) | Plating bath (5) |
|---|---|---|---|---|
| Cu: 15 g/L | Cu: 15 g/L | Cu: 20 g/L | Cu: 5 g/L | Cu: 10 g/L |
| Ni: 8 g/L | $H_2SO_4$: 75 g/L | Ni: 5 g/L | Ni: 16 g/L | Ni: 10 g/L |
| Co: 8 g/L | Solution temperature: 25 to 35° C. | P: 1 g/L pH: 2 Temperature: 30° C. | Co: 16 g/L W: 1 g/L pH: 3 Temperature: 35° C. | Mo: 2 g/L P: 1 g/L pH: 3 Temperature: 35° C. |
| pH: 2 Solution temperature: 40° C. | | | | |

The plating baths are all aqueous solutions.

TABLE 4

| | Copper foil | | | | | |
|---|---|---|---|---|---|---|
| | Number of roughened particles (particles/μm²) | Minimum diameter (μm) | Maximum diameter (μm) | Average diameter (μm) B | Proportion of area corresponding to particles A × (B/2)^2 × π (μm2/μm2) | Peel strength [kN/m] |
| Example 1 | 9.9 | 0.166 | 0.498 | 0.215 | 0.361 | 0.85 |
| Example 2 | 12.3 | 0.091 | 0.581 | 0.182 | 0.320 | 0.74 |
| Example 3 | 15.3 | 0.083 | 0.415 | 0.123 | 0.182 | 0.70 |
| Example 4 | 9.9 | 0.166 | 0.498 | 0.215 | 0.361 | 0.85 |
| Example 5 | 9.9 | 0.166 | 0.498 | 0.215 | 0.361 | 0.85 |
| Example 6 | 412 | 0.011 | 0.152 | 0.040 | 0.518 | 0.68 |
| Example 7 | 9.9 | 0.165 | 0.494 | 0.213 | 0.355 | 0.84 |
| Example 8 | 9.9 | 0.171 | 0.513 | 0.221 | 0.383 | 0.88 |
| Example 9 | 9.9 | 0.169 | 0.508 | 0.219 | 0.376 | 0.87 |
| Example 10 | 9.9 | 0.164 | 0.493 | 0.213 | 0.354 | 0.84 |
| Example 11 | 9.9 | 0.163 | 0.488 | 0.211 | 0.347 | 0.83 |
| Example 12 | 9.9 | 0.168 | 0.503 | 0.217 | 0.368 | 0.86 |
| Example 13 | | | | | | 0.70 |
| Comparative Example 1 | 13.6 | 0.091 | 0.415 | 0.291 | 0.901 | 0.52 |
| Comparative Example 2 | 16.2 | 0.210 | 0.715 | 0.273 | 0.948 | 0.49 |
| Comparative Example 3 | 1102 | 0.009 | 0.124 | 0.033 | 0.919 | 0.51 |

| | Characteristics of resin | | | | | |
|---|---|---|---|---|---|---|
| | Proportion of white portions | Average length of black portions (μm) | Average length of white portions (μm) | Maximum length of black portions (μm) | Maximum length of white portions (μm) | Average length of largest 10 black portions (μm) | Average length of largest 10 white portions (μm) |
| Example 1 | 58% | 0.1461 | 0.2108 | 0.5584 | 0.7262 | 0.3260 | 0.4242 |
| Example 2 | 56% | 0.1418 | 0.1747 | 0.4598 | 0.8089 | 0.2659 | 0.4375 |
| Example 3 | 65% | 0.0979 | 0.1760 | 0.4166 | 0.7072 | 0.2104 | 0.4368 |
| Example 4 | 58% | 0.1461 | 0.2108 | 0.5584 | 0.7262 | 0.3260 | 0.4242 |
| Example 5 | 58% | 0.1461 | 0.2108 | 0.5584 | 0.7262 | 0.3260 | 0.4242 |
| Example 6 | 65% | 0.0423 | 0.0720 | 0.1802 | 0.2893 | 0.0909 | 0.1787 |
| Example 7 | 58% | 0.1449 | 0.2091 | 0.5539 | 0.1183 | 0.3234 | 0.4208 |
| Example 8 | 60% | 0.1505 | 0.2171 | 0.5752 | 0.7480 | 0.3358 | 0.4369 |
| Example 9 | 60% | 0.1490 | 0.2150 | 0.5696 | 0.7407 | 0.3325 | 0.4326 |
| Example 10 | 58% | 0.1446 | 0.2087 | 0.5528 | 0.7189 | 0.3227 | 0.4199 |
| Example 11 | 57% | 0.1432 | 0.2066 | 0.5472 | 0.7117 | 0.3195 | 0.4157 |
| Example 12 | 59% | 0.1475 | 0.2129 | 0.5640 | 0.7334 | 0.3293 | 0.4284 |
| Example 13 | 67% | 0.1077 | 0.1936 | 0.4582 | 0.7779 | 0.2315 | 0.4433 |
| Comparative Example 1 | 54% | 0.2086 | 0.2347 | 0.6212 | 0.7031 | 0.3450 | 0.4641 |
| Comparative Example 2 | 50% | 0.2123 | 0.2413 | 0.6312 | 0.6923 | 0.3511 | 0.4721 |
| Comparative Example 3 | 50% | 0.0259 | 0.0440 | 0.1102 | 0.1769 | 0.0556 | 0.1093 |

Figure 4:
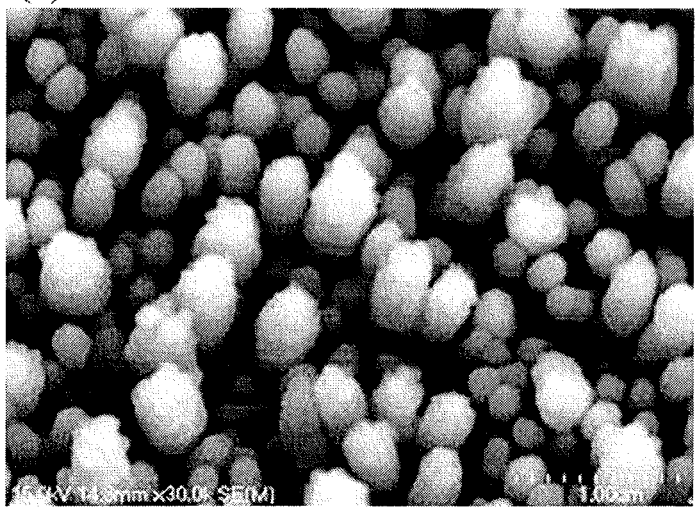
FIG. 4(a) shows the SEM image (×30000) of the copper foil-treated surface of Example 1.
FIG. 4(b) shows the SEM image (×30000) of the surface of the resin substrate of Example 1.
Figure 4:
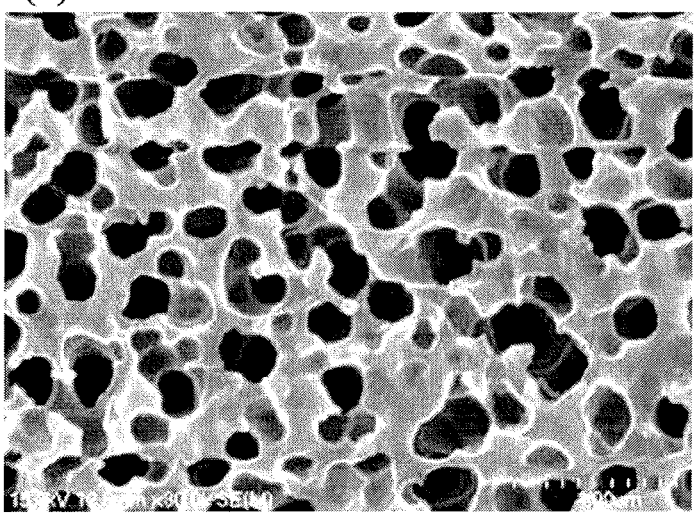

FIG. 4(a) shows the SEM image (×30000) of the copper-foil treated surface of Example 1, and FIG. 4(b) shows the SEM image (×30000) of the surface of the resin substrate of Example 1.

Figure 5:
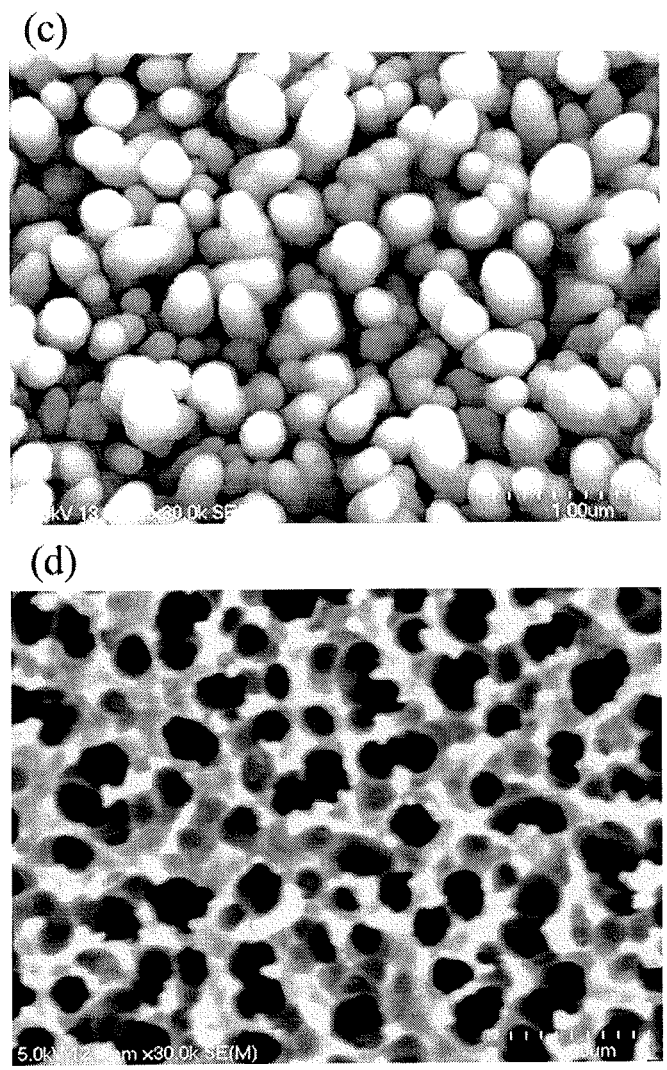
FIG. 5(c) shows the SEM image (×30000) of the copper foil-treated surface of Comparative Example 1.
FIG. 5(d) shows the SEM image (×30000) of the surface of the resin substrate of Comparative Example 1.

FIG. 5(c) shows the SEM image (×30000) of the copper foil-treated surface of Comparative Example 1, and FIG. 5(d) shows the SEM image (×30000) of the surface of the resin substrate of Comparative Example 1.

Figure 6:
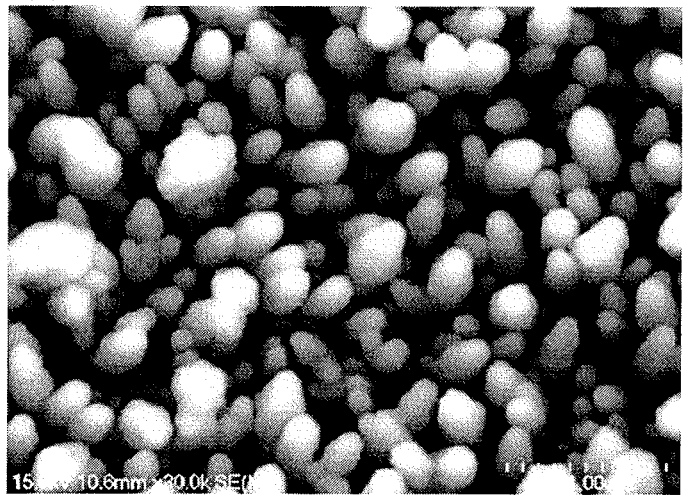
FIG. 6(e) shows the SEM image (×30000) of the copper foil-treated surface in Example 2.
FIG. 6(f) shows the SEM image (×30000) of the surface of the resin substrate of Example 2.
Figure 6:
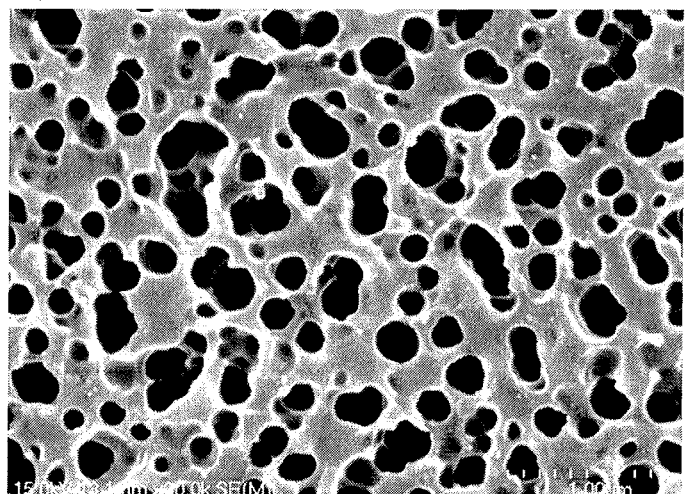

FIG. 6(e) shows the SEM image (×30000) of the copper-foil treated surface of Example 2, and FIG. 6(f) shows the SEM image (×30000) of the surface of the resin substrate of Example 2.

Figure 7:
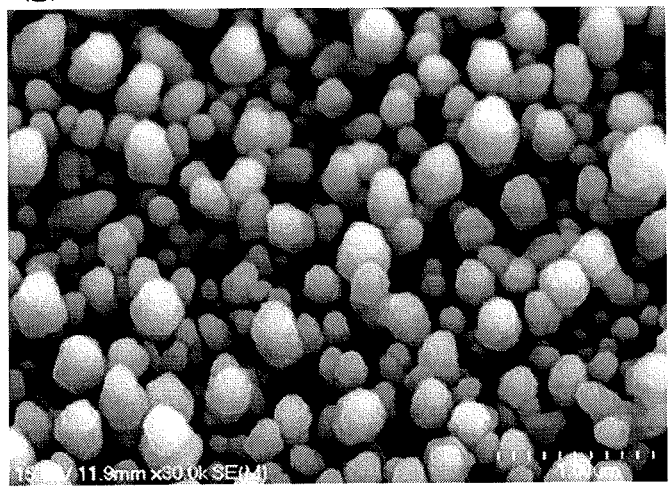
FIG. 7(g) shows the SEM image (×30000) of the copper foil-treated surface in Example 3.
FIG. 7(h) shows the SEM image (×30000) of the surface of the resin substrate of Example 3.
Figure 7:
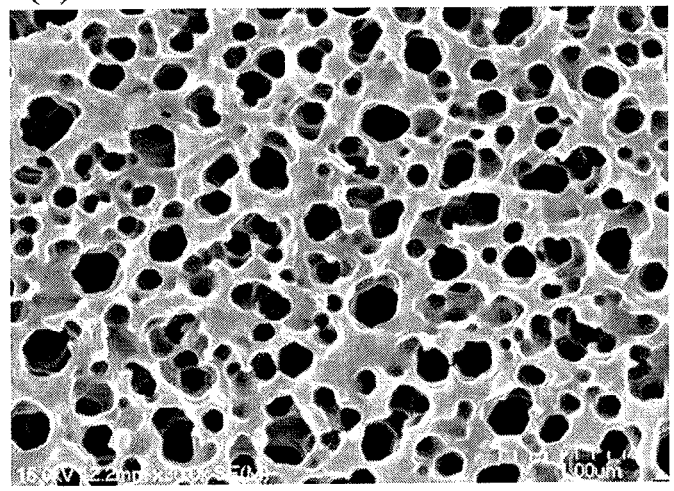

FIG. 7(g) shows the SEM image (×30000) of the copper-foil treated surface of Example 3, and FIG. 7(h) shows the SEM image (×30000) of the surface of the resin substrate of Example 3.

Figure 8:
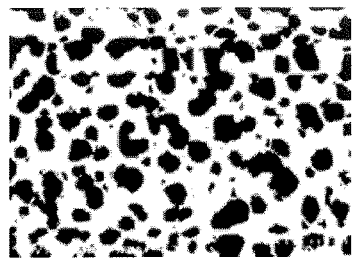
FIGS. 8(1) to 8(4) show the images of Example 1, Comparative Example 1, Example 2 and Example 3, respectively, obtained by using Photo Shop 7.0 software, and used for the evaluations of the white portions and the black portions in the above-described measurements.
Figure 8:
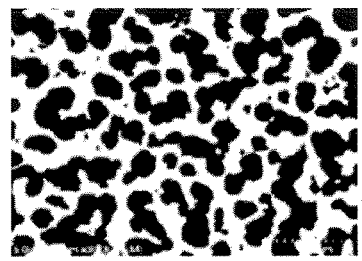
Figure 8:
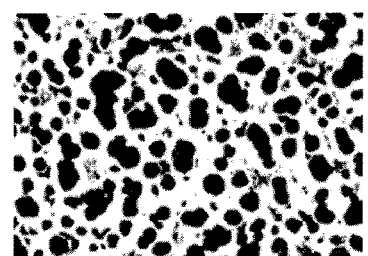
Figure 8:
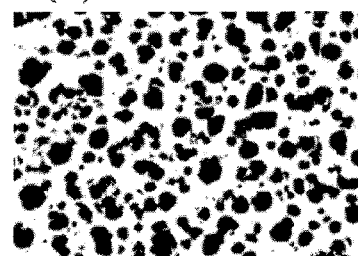

FIG. 8(1) shows the image of Example 1, obtained by using Photo Shop 7.0 software, and used for the evaluations of the white portions and the black portions in the above-described measurements.

FIG. 8(2) shows the image of Comparative Example 1, obtained by using Photo Shop 7.0 software, and used for the evaluations of the white portions and the black portions in the above-described measurements.

FIG. 8(3) shows the image of Example 2, obtained by using Photo Shop 7.0 software, and used for the evaluations of the white portions and the black portions in the above-described measurements.

FIG. 8(4) shows the image of Example 3, obtained by using Photo Shop 7.0 software, and used for the evaluations of the white portions and the black portions in the above-described measurements.

The invention claimed is:

1. A surface-treated copper foil, wherein a surface-treated layer is formed on a copper foil, satisfying at least one of the following (A) to (I):
   (A) the number density of the particles on the surface of the surface-treated layer is 3.8 to 430 particles/$\mu m^2$, and the proportion of the area corresponding to the particles of the surface of the surface-treated layer is 0.1 to 0.85,
   (B) the average diameter of the particles on the surface of the surface-treated layer is 0.03 to 0.28 $\mu m$, and the number density of the particles on the surface of the surface-treated layer is 3.8 to 430 particles/$\mu m^2$,
   (C) the number density of the particles on the surface of the surface-treated layer is 3.8 to 430 particles/$\mu m^2$,
   (D) when a surface-treated copper foil is bonded, via the surface-treated layer side of the surface-treated copper foil, to a resin substrate and the surface-treated copper foil is removed, the average length of white portions on the surface, on the copper foil removal side, of the resin substrate is 0.07 to 0.23 $\mu m$,
   (E) when a surface-treated copper foil is bonded, via the surface-treated layer side of the surface-treated copper foil, to a resin substrate and the surface-treated copper foil is removed, the maximum length of the white portions on the surface, on the copper foil removal side, of the resin substrate is 0.704 to 0.88 $\mu m$,
   (F) when a surface-treated copper foil is bonded, via the surface-treated layer side of the surface-treated copper foil, to a resin substrate and the surface-treated copper foil is removed, the average length of the largest 10 white portions on the surface, on the copper foil removal side, of the resin substrate is 0.15 to 0.457 $\mu m$,
   (G) when a surface-treated copper foil is bonded, via the surface-treated layer side of the surface-treated copper foil, to a resin substrate and the surface-treated copper foil is removed, the average length of black portions on the surface, on the copper foil removal side, of the resin substrate is 0.035 to 0.20 $\mu m$,
   (H) when a surface-treated copper foil is bonded, via the surface-treated layer side of the surface-treated copper foil, to a resin substrate and the surface-treated copper foil is removed, the maximum length of the black portions on the surface, on the copper foil removal side, of the resin substrate is 0.180 to 0.605 $\mu m$, and the number density of the particles on the surface of the surface-treated layer is 3.8 to 430 particles/$\mu m^2$, or
   (I) when a surface-treated copper foil is bonded, via the surface-treated layer side of the surface-treated copper foil, to a resin substrate and the surface-treated copper foil is removed, the average length of the largest 10 black portions on the surface, on the copper foil removal side, of the resin substrate is 0.06 to 0.335 $\mu m$.

2. A copper foil with carrier, comprising on one side or both sides of the carrier, an intermediate layer and an ultra-thin copper layer in this order, wherein the ultra-thin copper layer is the surface-treated copper foil according to claim 1, and optionally the surface-treated copper foil comprising a resin layer on the surface-treated layer.

3. A substrate prepared by bonding the surface-treated copper foil according to claim 1, via the surface-treated layer side of the surface-treated copper foil, to a substrate, and by removing the surface-treated copper foil, or
   a substrate prepared by bonding a copper foil with carrier, comprising a carrier, an intermediate layer and an ultra-thin copper layer in this order, wherein the ultra-thin copper layer is the surface-treated copper foil according to claim 1, via the ultra-thin copper layer side of the copper foil with carrier, to a substrate, and by removing the copper foil with carrier, and satisfying at least one of the following (1) to (7):
   (1) the average length of the white portions on the surface, on the copper foil removal side, is 0.07 to 0.23 $\mu m$,
   (2) the maximum length of the white portions on the surface, on the copper foil removal side, is 0.704 to 0.88 $\mu m$,
   (3) the average length of the largest 10 white portions on the surface, on the copper foil removal side, is 0.15 to 0.457 $\mu m$,
   (4) the average length of the black portions on the surface, on the copper foil removal side, is 0.035 or more and less than 0.20 $\mu m$,
   (5) the maximum length of the black portions on the surface, on the copper foil removal side, is 0.180 to 0.605 $\mu m$,
   (6) the average length of the largest 10 black portions on the surface, on the copper foil removal side, is 0.06 to 0.335 $\mu m$, or
   (7) the proportion of the white portions on the surface, on the copper foil removal side, of the substrate is 55 to 68%.

4. The surface-treated copper foil according to claim 1, satisfying at least one of the following (1) to (4):
   (1) the surface-treated layer is a roughening-treated layer,
   (2) the surface-treated layer is a roughening-treated layer, and the surface-treated copper foil comprises, on the surface of the roughening-treated layer, one or more layers selected from the group consisting of a heat resistant layer, a rust-preventing layer, a chromate-treated layer and a silane coupling treated layer,
   (3) the surface-treated layer is one or more layers selected from the group consisting of a roughening-treated layer, a heat resistant layer, a rust-preventing layer, a chromate-treated layer and a silane coupling treated layer, or
   (4) the surface-treated layer is provided with a resin layer on the surface-treated layer.

5. A method for producing a printed wiring board, comprising:
   a step of preparing the surface-treated copper foil according to claim 1 or a copper foil with carrier comprising a carrier, an intermediate layer and an ultra-thin copper layer in this order, wherein the ultra-thin copper layer is the surface-treated copper foil according to claim 1, and an insulating substrate or a resin layer formed with a metal foil or a copper foil with carrier;
   a step of laminating the surface-treated copper foil, via the surface-treated layer side of the surface-treated copper foil, on the insulating substrate or the resin layer, or a step of laminating the copper foil with carrier, via the ultra-thin copper layer side of the surface-treated copper foil, on the insulating substrate or the resin layer, and then, peeling the carrier of the copper foil with carrier;
   a step of removing the surface-treated copper foil on the insulating substrate or the resin layer, or a step of removing the ultra-thin copper layer on the insulating substrate or the resin layer after the peeling of the carrier; and
   a step of forming a circuit on the surface of the insulating substrate or the resin layer with the surface-treated copper foil or the ultra-thin copper layer removed therefrom.

6. A method for producing a printed wiring board, comprising:

a step of preparing the surface-treated copper foil according to claim 1, or a copper foil with carrier, comprising a carrier, an intermediate layer and an ultra-thin copper layer in this order, wherein the ultra-thin copper layer is the surface-treated copper foil according to claim 1, and an insulating substrate;

a step of forming a copper clad laminate by laminating the surface-treated copper foil, via the surface-treated layer side of the surface-treated copper foil, on the insulating substrate, or a step of forming a copper clad laminate by laminating the copper foil with carrier, via the ultra-thin copper layer side of the surface-treated copper foil, on the insulating substrate, and then, peeling the carrier of the copper foil with carrier; and a step of subsequently forming a circuit by a semi-additive method, a subtractive method, a partly additive method or a modified semi-additive method.

7. A method for producing a printed wiring board, comprising:

a step of preparing the surface-treated copper foil according to claim 1, with a circuit formed on the surface-treated layer formed side, or a copper foil with carrier, comprising a carrier, an intermediate layer and an ultra-thin copper layer in this order, wherein the ultra-thin copper layer is the surface-treated copper foil according to claim 1, with a circuit formed on the surface of the surface-treated copper foil on the ultra-thin copper layer side;

a step of forming a resin layer on the surface of the surface-treated copper foil or the surface of the copper foil with carrier so as for the circuit to be embedded; and a step of exposing the circuit embedded in the resin layer by removing the surface-treated copper foil or the copper foil with carrier.

8. A method for producing a copper clad laminate comprising using the surface-treated copper foil according to claim 1, or using a copper foil with carrier, comprising a carrier, an intermediate layer and an ultra-thin copper layer in this order, wherein the ultra-thin copper layer is the surface-treated copper foil according to claim 1.

9. A method for producing a printed wiring board comprising using the surface-treated copper foil according to claim 1, or using a copper foil with carrier, comprising a carrier, an intermediate layer and an ultra-thin copper layer in this order, wherein the ultra-thin copper layer is the surface-treated copper foil according to claim 1.

10. A method for producing an electronic device using the printed wiring board produced by the method according to claim 9.

11. A surface-treated copper foil, wherein a surface-treated layer is formed on a copper foil, satisfying at least one of the following (A) to (I), and when the surface-treated copper foil is bonded, via the surface-treated layer side of the surface-treated copper foil, to a resin substrate and the surface-treated copper foil is removed, the proportion of the white portions on the surface, on the copper foil removal side, of the resin substrate is 55 to 68%, (A) the number density of the particles on the surface of the surface-treated layer is 3.8 to 430 particles/$\mu m^2$, and the proportion of the area corresponding to the particles of the surface of the surface-treated layer is 0.1 to 0.85, (B) the average diameter of the particles on the surface of the surface-treated layer is 0.03 to 0.28 μm, and the number density of the particles on the surface of the surface-treated layer is 3.8 to 430 particles/$\mu m^2$, (C) the number density of the particles on the surface of the surface-treated layer is 3.8 to 430 particles/$\mu m^2$, (D) when a surface-treated copper foil is bonded, via the surface-treated layer side of the surface-treated copper foil, to a resin substrate and the surface-treated copper foil is removed, the average length of white portions on the surface, on the copper foil removal side, of the resin substrate is 0.07 to 0.23 μm, (E) when a surface-treated copper foil is bonded, via the surface-treated layer side of the surface-treated copper foil, to a resin substrate and the surface-treated copper foil is removed, the maximum length of the white portions on the surface, on the copper foil removal side, of the resin substrate is 0.704 to 0.88 μm, (F) when a surface-treated copper foil is bonded, via the surface-treated layer side of the surface-treated copper foil, to a resin substrate and the surface-treated copper foil is removed, the average length of the largest 10 white portions on the surface, on the copper foil removal side, of the resin substrate is 0.15 to 0.457 μm, (G) when a surface-treated copper foil is bonded, via the surface-treated layer side of the surface-treated copper foil, to a resin substrate and the surface-treated copper foil is removed, the average length of black portions on the surface, on the copper foil removal side, of the resin substrate is 0.035 to 0.20 μm, (H) when a surface-treated copper foil is bonded, via the surface-treated layer side of the surface-treated copper foil, to a resin substrate and the surface-treated copper foil is removed, the maximum length of the black portions on the surface, on the copper foil removal side, of the resin substrate is 0.180 to 0.605 μm, or (I) when a surface-treated copper foil is bonded, via the surface-treated layer side of the surface-treated copper foil, to a resin substrate and the surface-treated copper foil is removed, the average length of the largest 10 black portions on the surface, on the copper foil removal side, of the resin substrate is 0.06 to 0.335 μm.

12. The surface-treated copper foil according to claim 11, satisfying at least one of the following (1) to (4):

(1) the surface-treated layer is a roughening-treated layer, (2) the surface-treated layer is a roughening-treated layer, and the surface-treated copper foil comprises, on the surface of the roughening-treated layer, one or more layers selected from the group consisting of a heat resistant layer, a rust-preventing layer, a chromate-treated layer and a silane coupling treated layer, (3) the surface-treated layer is one or more layers selected from the group consisting of a roughening-treated layer, a heat resistant layer, a rust-preventing layer, a chromate-treated layer and a silane coupling treated layer, or (4) the surface-treated layer is provided with a resin layer on the surface-treated layer.

13. A copper foil with carrier, comprising on one side or both sides of the carrier, an intermediate layer and an ultra-thin copper layer in this order, wherein the ultra-thin copper layer is the surface-treated copper foil according to claim 11, and optionally the surface-treated copper foil comprising a resin layer on the surface-treated layer.

* * * * *